United States Patent
An

(10) Patent No.: US 12,063,023 B2
(45) Date of Patent: Aug. 13, 2024

(54) METHOD OF MANUFACTURING A PIEZOELECTRIC THIN FILM

(71) Applicant: WAVELORD CO., LTD., Gyeonggi-do (KR)

(72) Inventor: Sang Jeong An, Incheon (KR)

(73) Assignee: WAVELORD CO., LTD., Gyeonggi-do (KR)

( * ) Notice: Subject to any disclaimer, the term of this patent is extended or adjusted under 35 U.S.C. 154(b) by 471 days.

(21) Appl. No.: 17/434,823

(22) PCT Filed: Feb. 28, 2020

(86) PCT No.: PCT/KR2020/002938
§ 371 (c)(1),
(2) Date: Aug. 30, 2021

(87) PCT Pub. No.: WO2020/175971
PCT Pub. Date: Sep. 3, 2020

(65) Prior Publication Data
US 2022/0149802 A1 May 12, 2022

(30) Foreign Application Priority Data

Feb. 28, 2019 (KR) .................... 10-2019-0023998
Mar. 25, 2019 (KR) .................... 10-2019-0033781
Apr. 19, 2019 (KR) .................... 10-2019-0046009

(51) Int. Cl.
*H03H 3/02* (2006.01)
*C23C 14/06* (2006.01)
(Continued)

(52) U.S. Cl.
CPC ........... *H03H 3/02* (2013.01); *C23C 14/0617* (2013.01); *C23C 16/303* (2013.01);
(Continued)

(58) Field of Classification Search
CPC .......... H03H 3/02; H03H 9/171; H03H 9/564; H03H 9/581; H03H 9/02015; Y10T 29/42
(Continued)

(56) References Cited

U.S. PATENT DOCUMENTS 7,011,707 B2 * 3/2006 Nagai ............... H01L 21/02664
257/E21.127
8,633,508 B2 * 1/2014 Song .................... H01L 33/007
257/E33.013
(Continued)

FOREIGN PATENT DOCUMENTS

JP 2002-299253 A 10/2002
JP 2005-235796 A 9/2005
(Continued)

OTHER PUBLICATIONS

International Search Report from corresponding PCT Application No. PCT/KR2020/002938, dated Jul. 1, 2020.

*Primary Examiner* — Thiem D Phan
(74) *Attorney, Agent, or Firm* — Harness, Dickey & Pierce, P.L.C.

(57) ABSTRACT

Disclosed is a method for manufacturing a piezoelectric $Al_xGa_{1-x}N$ ($0.5 \le x \le 1$) thin film, comprising: forming a stress control layer comprised of a Group III nitride on a silicon substrate by chemical vapor deposition (CVD); and depositing a piezoelectric $Al_xGa_{1-x}N$ ($0.5 \le x \le 1$) thin film on the stress control layer, the thin film being deposited by PVD at 0.3 Tm (Tm is melting temperature of a piezoelectric thin film material) or higher. Further, a method for manufacturing a device in conjunction with piezoelectric $Al_xGa_{1-x}N$ ($0.5 \le x \le 1$) thin films is provided.

4 Claims, 14 Drawing Sheets

(51) Int. Cl.
*C23C 16/30* (2006.01)
*C30B 23/02* (2006.01)
*C30B 25/18* (2006.01)
*C30B 29/40* (2006.01)
*H10N 30/00* (2023.01)
*H10N 30/076* (2023.01)
*H10N 30/079* (2023.01)
*H10N 30/853* (2023.01)

(52) U.S. Cl.
CPC ............ *C30B 23/025* (2013.01); *C30B 25/18* (2013.01); *C30B 29/406* (2013.01); *H10N 30/076* (2023.02); *H10N 30/079* (2023.02); *H10N 30/708* (2024.05); *H10N 30/853* (2023.02); *Y10T 29/42* (2015.01)

(58) Field of Classification Search
USPC ..................................... 29/25.35, 592.1, 829
See application file for complete search history.

(56) References Cited

U.S. PATENT DOCUMENTS 8,698,119 B2 * 4/2014 Tendulkar ............ H10N 70/826
438/129
2006/0186759 A1 8/2006 Kim et al.
2011/0140102 A1 6/2011 Song
2011/0163294 A1 7/2011 Song
2016/0035932 A1 2/2016 Cha et al.

FOREIGN PATENT DOCUMENTS

| | | |
|---|---|---|
| JP | 2007-312154 A | 11/2007 |
| KR | 10-2005-0010710 A | 1/2005 |
| KR | 10-2009-0115322 A | 11/2009 |
| KR | 10-2009-0115826 A | 11/2009 |
| KR | 10-2014-0058012 A | 5/2014 |

* cited by examiner (a)

(b)

(a)

(b)

(c)

(d)

(e)

(f)

(c)

(d)

(e)

(f)

(a)

(b)

(c)

(d)

(e)

(f)

METHOD OF MANUFACTURING A PIEZOELECTRIC THIN FILM

CROSS-REFERENCE TO RELATED APPLICATIONS

This application is a National Phase application of PCT Application No. PCT/KR2020/002938 filed on Feb. 28, 2020, which claims priority to Korean Patent Application No. 10-2019-0023998 filed on Feb. 28, 2019, Korean Patent Application No. 10-2019-0033781, filed on Mar. 25, 2019, and Korean Patent Application No. 10-2019-0046009, filed on Apr. 19, 2019. The entire disclosures of the applications identified in this paragraph are incorporated herein by reference.

TECHNICAL FIELD

The present disclosure relates generally to methods for manufacturing piezoelectric $Al_xGa_{1-x}N$ ($0.5 \leq x \leq 1$) thin films with high purity, methods for manufacturing devices in conjunction with the thin films. In particular, it relates to methods for manufacturing piezoelectric $Al_xGa_{1-x}N$ ($0.5 \leq x \leq 1$) thin films (more preferably, piezoelectric AlN thin films) with high purity as well as excellent crystallinity and polarity, and devices in conjunction with the thin films. These high purity piezoelectric $Al_xGa_{1-x}N$ ($0.5 \leq x \leq 1$) thin films are used in a broad range of applications of resonators, including, but without being limited thereto, high quality high frequency (HF) filters, energy harvesters, ultrasonic transducers, sensors for bio & IoT, etc. Now, these thin films are also used as acoustic resonators (e.g., surface acoustic wave (SAW) resonators, bulk acoustic wave (BAW) resonators) for filters that are used in portable electronic devices such as smart phones, and as high-sensitivity sensors in bio & IoT applications. These simply illustrate a few applications of piezoelectric $Al_xGa_{1-x}N$ ($0.5 \leq x \leq 1$) thin films, and such thin films are expected to be used in even broader range of industries without limitation.

BACKGROUND

This section provides background information related to the present disclosure which is not necessarily prior art.

Piezoelectric AlN thin films are known to demonstrate their own unique properties, for example, high longitudinal acoustic wave velocity (approximately 11,000 m/s), high thermal stability (melting temperature=2,100° C., the film maintains its piezoelectric properties up to 1,150° C.), high wide energy bandgap (6.2 eV), and excellent piezoelectric and dielectric properties (Nano Energy 51 (2018) pp. 146-161, "Piezoelectric AlN thin films for energy harvesting and acoustic devices"). Their applications are found in a variety of fields using resonators. such as high-quality HF filters, energy harvesters, ultrasonic transducers, sensors for bio & IoT, etc. Moreover, they are highly demanded in certain industries where ultrasmall high-efficiency products are absolutely required through enhanced functionality and versatility. In general, piezoelectric AlN thin films are synthesized by physical vapor deposition (PVD) (e.g., sputtering) which involves poly-crystal deposition at a temperature around 400° C., and chemical vapor deposition (CVD) (e.g., MOCVD or HVPE) which involves epitaxial single crystal growth at a temperature around 1000° C. Some of currently used processes for the synthesis (e.g., deposition or growth) of piezoelectric AlN thin films have become available after taking the design of a resulting device into consideration. For example, on a high resistance Si substrate for film synthesis, an insulating layer (e.g., $SiO_2$) and/or a single or multilayer films of metals serving as electrodes (e.g., Mo, Ti, Pt, W, or Al) are formed, followed by poly-crystal AlN deposition at a temperature around 400° C. and optionally post annealing if needed, to obtain a device in a desired design. As will be described in detail below in FIG. 15, however, piezoelectric AlN thin films deposited on an insulating and/or metal layer at a temperature around 400° C. due to limitations of the physical process conditions have textured polycrystal microstructures, as compared with piezoelectric AlN thin films obtained by depositing at a high temperature around 1000° C. that have epitaxial single crystal microstructures. Consequently, the former demonstrated inferior physical properties including piezoelectric properties, which put limits on a variety of devices in conjunction with the piezoelectric AlN thin film in terms of their performance and potential broad fields of application. In other words, as the formation of a single or multiple insulating and/or metal layers precedes the synthesis of a piezoelectric AlN thin film, the crystalline and polar qualities of piezoelectric AlN thin films and any devices in conjunction with the thin films in the art are affected by certain physical factors including, for example, deposition temperature and surface material conditions, which possibly makes it hard to synthesize piezoelectric AlN thin films using high-purity single crystals. Several techniques have been proposed to overcome these limits in preparation of high-purity single crystalline piezoelectric AlN thin films and relevant devices. For example, an AlN material may be grown, by MOCVD, on an epitaxial synthesis substrate (sapphire, SiC) that has the identical/similar with/to the AlN material at a high temperature around 1000° C. Alternatively, an AlN material may be sputtered on a silicon epitaxial synthesis substrate at the highest possible temperature and the resulting piezoelectric AlN thin film is transferred onto a device substrate after it is subjected to wafer bonding and lift-off processes to be separated from the Si substrate used for film synthesis.

FIG. 1 illustrates devices in conjunction with piezoelectric thin films as disclosed in US patent application publication No. 2015-0033520. FIG. 1A illustrates a FBAR (Film Bulk Acoustic Resonator) 20, and FIG. 1B illustrates a Solidly Mounted Resonator (SMR). FBAR and SMR are BAW resonators. FBAR 20 is comprised of a pair of electrodes 22 and 24 and a piezoelectric film 26 between the electrodes 22 and 24, and a device substrate 30. The electrode pair 22 and 24 and the piezoelectric film 26 are suspended over a cavity 28 defined in the device substrate 30. SMR 20' comprises a pair of electrodes 22' and 24', a piezoelectric film 26' between the electrodes 22' and 24', and a device substrate 30'. Instead of a cavity 28 reflector in the FBAR 20, a multilayer Bragg reflector 27' is provided.

FIGS. 2-4 show methods for manufacturing piezoelectric AlN thin films and devices in conjunction with the films, as disclosed in US patent application publication No. 2015-0033520. Single crystalline piezoelectric AlN thin films are epitaxially grown on a sapphire substrate ($Al_2O_3$) (see FIG. 2A). High quality, high purity, single crystalline piezoelectric AlN thin films are synthesized by MOCVD, which is chemical vapor deposition, or by HVPE, as compared with the prior art where $SiO_2$ films and Mo electrodes are typically formed on a Si substrate and piezoelectric AlN films are then synthesized thereon by PVD (e.g., sputtering). Next, contacts are formed on the AlN films (see FIG. 2B). For an SMR, a Bragg reflector ($SiO_2$/W) is formed on a semiconductor substrate (see FIG. 3C). After that, wafer bonding is carried out between piezoelectric AlN thin film structure 40 and Bragg reflector structure 42 (see FIG. 3D). The sapphire substrate is then removed from the combined structure 44 by laser lift-off (LLO) (see FIG. 3E). Lastly, a top electrode is formed on a device 46 free of the sapphire substrate (see FIG. 3F) to obtain the SMR. For an FBAR, on the other hand, an air cavity is formed in a semiconductor substrate (see FIG. 4C), and piezoelectric AlN thin film structure 40 and cavity structure 52 are bonded (see FIG. 4D). The sapphire substrate is then removed from the combined structure 54 by laser lift-off (LLO) (see FIG. 4E). Lastly, a top electrode is formed on a device 56 free of the sapphire substrate (see FIG. 4F) to obtain the FBAR.

It has been found out that single crystalline piezoelectric AlN thin films that are grown by MOCVD on the sapphire substrate have substantially improved the performance and quality of a resonator, unlike polycrystalline piezoelectric AlN thin films deposited by sputtering over SiO2 and/or metal (electrode) materials on the Si substrate in the prior art. When an energy band gap of 6.2 eV is converted to wavelengths on the sapphire substrate, and piezoelectric AlN thin films having optical properties at a short wavelength of 200 nm need to be grown directly on the substrate, it is not easy to separate the films from the substrate later using excimer laser radiation as a light source, such as ArF (193 nm) and KrF (248 nm) commercially available nowadays. This is because LLO mechanism for separating specific films or layers from the substrate by laser radiation is based on thermo-chemical decomposition reactions which include strong laser absorption and conversion to thermal energy at an interface between two material layers. The bottom line of the LLO is that there should be a sacrificial layer composed of suitable materials for absorbing laser radiation and converting it to thermal energy between the optically transparent substrate and specific thin films synthesized thereon. Therefore, it is absolutely necessary that the materials for this sacrificial layer should be an optically transparent semiconductor that has an energy band gap corresponding to a wavelength substantially larger than the laser radiation entered through the back plane of the optically transparent sapphire substrate and have an amorphous, polycrystalline, or multiplayer microstructure that is capable of absorbing the laser radiation as much as possible. The method disclosed in US patent application publication No. 2015-0033520, however, overlooked this point.

FIG. 5 illustrates a method for manufacturing a device in conjunction with piezoelectric AlN thin films as disclosed in US patent application publication No. 2006-0145785. As shown, a buffer layer 210 (e.g., GaN) is grown on a sapphire substrate 200, a piezoelectric AlN thin film 220 is then formed on the buffer layer 210, and a bonding metal 230 (e.g., Au) is provided on the piezoelectric AlN thin film 220.

Gallium nitride (GaN) composing the buffer layer 210 is a material that has an energy band gap of 3.4 eV (corresponding to a wavelength length of 364 nm) and an amorphous microstructure of a film grown at low temperatures. Unlike the AlN film, the GaN buffer layer 210 can adequately serve as a sacrificial layer such that the transparent sapphire substrate 200 and the piezoelectric AlN thin film 220 are readily separated. However, the GaN buffer layer 210 greatly differs from the piezoelectric AlN thin film 220 in terms of physical properties including lattice constant and thermal expansion coefficient. Up to date, there is no known technology or process that is effective for obtaining high purity single crystalline piezoelectric AlN thin films 220 grown by MOCVD to a certain critical thickness (approximately 100 nm) to be used as a functional piezoelectric thin film for resonators.

FIG. 15 illustrates a method for manufacturing a device in conjunction with piezoelectric AlN thin films as described in "Solid-State Electronics", 2010; Vol. 54: 1041-1046. The method comprises forming a piezoelectric AlN thin film 62 directly on a (100) Si substrate 61 by sputter deposition (see FIG. 15A), followed by a bottom electrode 63 (see FIG. 15B), an acoustic mirror 64 (see FIG. 15C), and a carrier wafer 65 by wafer bonding (see FIG. 15D) in sequence. Then, the (100) Si substrate 61 is removed by wet etching as shown in FIG. 15E, and lastly, a top electrode 66 is formed on the piezoelectric AlN thin film 62 free of the Si substrate 61 (see FIG. 15F) to obtain an SMR BAW resonator. As compared with a structure comprised of $SiO_2$ and/or metal (electrode) and a piezoelectric AlN thin film on a Si substrate ("Optimization of sputter deposition Process for piezoelectric AlN ultra-thin Films", Semester Project, Advanced NEMS group, Autumn Semester 2017, Roman Welz, Jan. 23, 2018, SECTION MICROTECHNIQUE), piezoelectric thin films obtained from the method in FIG. 15 have a uniform thickness and are free of native oxides present on the surface of the electrode (metal) that exert significant effects on the quality of the films, eliminating the need of a separate chemical-mechanical polishing (CMP) for quality enhancement. In other words, this method outmatches those in the prior art as far as the quality and cost are concerned.

In addition, there are other growth methods for high purity piezoelectric AlN thin films on a SiC substrate. However, the SiC substrate is usually pricy, and cannot be reused after it is removed by a chemical wet etching process during the manufacture of a piezoelectric AlN thin film resonator. Therefore, these do not present a fundamental solution for reducing high manufacturing costs of a piezoelectric AlN thin film resonator.

In "Thornton's theory for the Adatom Surface Mobility", a substrate for the synthesis (e.g., deposition or growth) of high purity piezoelectric AlN films typically having a melting temperature (Tm) of 2200° C. must have surface temperature of at least 0.3 Tm (600° C. for AlN) during the process such that adatoms on the surface start diffusing until a layer of film material has a close packing ratio reaching a single crystal bulk level and c-oriented textured polycrystals are formed on the surface of the substrate. When the surface temperature of the substate is raised even further to 0.5 Tm (1100° C. for AlN) or higher, psuedomorphic mosaic structured single crystals are formed and high purity thin films are obtained accordingly. A better or preferred way of increasing the surface temperature of the substrate to synthesize high purity thin films is that, instead of having the back plane of the substrate warmed up with a heater, the substrate, i.e., a plane of the substrate on which films are to be synthesized, is directly bombarded with accelerated plasma particles (protons, electrons, neutrons). Moreover, the type of materials used is also a key factor in the synthesis (e.g., deposition or growth) of high purity piezoelectric AlN thin films having a hexagonal close packed crystal structure (HCP). For example, Group III nitrides (AlN, GaN, AlGaN, AlInN, or InGaN) and Group II oxides (ZnO, MgO, or MgZnO) having the same crystal structure, or sapphire and silicon carbide (SiC) materials having a similar crystal structure are preferentially selected. Further, any materials having a relatively lower surface roughness including, without limitation, $SiO_2$, $SiN_x$ or semiconductor (Si) materials, rather than those metals (electrodes) such as Mo, W, Ti or Al having a relatively higher surface roughness, offer more advantages in terms of surface mobility of adatoms. Besides the conditions mentioned above, it is also important to keep the inflow of oxygen ($O_2$) from the surroundings (including the substrate) to a minimum, and to completely remove any residuals on the surface of the substrate, including hydrogen, hydrogen compounds, and other contaminants.

Another example of the epitaxial synthesis of piezoelectric AlN thin films is described in Physics Letter A 375 (2011) 1000-1004, "Single-crystalline AlN growth on sapphire using physical vapor deposition", Andres M. Cardenas-Valencia, Shinzo Onishi, Benjamin Rossie, in which a magnetron sputtering gun is introduced at a sapphire substrate of which temperature is set to 860° C. for deposition, resulting in a 4 µm-thick single-crystal piezoelectric AlN thin film. In general, the quality of piezoelectric AlN thin films is assessed with regard to both crystallinity and polarity. The crystalline quality is indicated by full width of half-maximum (FWHM) on the X-ray rocking curve. Considering that FWHM of any commercially available structure of Si substrate/$SiO_2$/metal electrode/AlN ranges from 1.2 to 2.5°, the structure described in the document has FWHM of 0.32°, demonstrating considerable improvement in crystalline quality. That is to say, while Thornton stressed on the importance of film synthesis (e.g., deposition or growth) techniques or methods using CVD or PVD by his theory for the adatom surface mobility, this document proved that the temperature, crystal structure of a material used, and surface condition of a substrate are also influential factors. On the other hand, the polar quality cannot be assessed by FWHM on the X-ray rocking curve only. Although the document did not specifically mention polar quality assessment, it is well known that the polar quality of a piezoelectric AlN thin film can be determined through surface wet etching. Again, it turned out that film synthesis methods (e.g., deposition or growth) and materials and surface conditions of a substrate may have a significant impact on the polar quality.

SUMMARY

Objectives of the present invention will be described in the following detailed description of illustrative embodiments.

This section provides a general summary of the disclosure and is not a comprehensive disclosure of its full scope or all of its features.

According to one aspect of the disclosure, there is provided a method for manufacturing piezoelectric $Al_xGa_{1-x}N$ ($0.5 \leq x \leq 1$) thin films with high purity, comprising: forming a sacrificial layer on a sapphire substrate; and epitaxially growing a single crystalline piezoelectric $Al_xGa_{1-x}N$ ($0.5 \leq x \leq 1$) thin film on the sacrificial layer, characterized in that the method further comprises forming a first semiconductor layer of $Al_yGa_{1-y}N$ ($0.5 \leq y \leq 1$) before growing the piezoelectric $Al_xGa_{1-x}N$ ($0.5 \leq x \leq 1$) thin film.

According to another aspect of the disclosure, there is provided a structure in conjunction with a piezoelectric $Al_xGa_{1-x}N$ ($0.5 \leq x \leq 1$) thin film, comprising: a piezoelectric $Al_xGa_{1-x}N$ ($0.5 \leq x \leq 1$) thin film; a first electrode provided on one side of the piezoelectric $Al_xGa_{1-x}N$ ($0.5 \leq x \leq 1$) thin film; a second electrode and reflector provided on the other side of the piezoelectric $Al_xGa_{1-x}N$ ($0.5 \leq x \leq 1$) thin film, opposite to the first electrode, wherein a face of the piezoelectric $Al_xGa_{1-x}N$ ($0.5 \leq x \leq 1$) thin film on which the first electrode is provided is an Al-polarity or Al-polarity and Ga-polarity mixed face.

According to another aspect of the disclosure, there is provided a method for manufacturing a piezoelectric $Al_xGa_{1-x}N$ ($0.5 \leq x \leq 1$) thin film, comprising: forming a sacrificial layer on a sapphire substrate, the sacrificial layer being comprised of one of a Group III nitride formed by CVD or a Group II or III oxide formed by PVD; and depositing a piezoelectric $Al_xGa_{1-x}N$ ($0.5 \leq x \leq 1$) thin film on the sacrificial layer, the thin film being deposited by PVD at 0.3 Tm (Tm is melting temperature of a piezoelectric thin film material) or higher.

According to another aspect of the disclosure, there is provided a method for manufacturing a piezoelectric $Al_xGa_{1-x}N$ ($0.5 \leq x \leq 1$) thin film, comprising: forming a stress control layer comprised of a Group III nitride on a silicon substrate by CVD; and depositing a piezoelectric $Al_xGa_{1-x}N$ ($0.5 \leq x \leq 1$) thin film on the stress control layer, the thin film being deposited by PVD at 0.3 Tm (Tm is melting temperature of a piezoelectric thin film material) or higher.

According to another aspect of the disclosure, there is provided a method for manufacturing a device in conjunction with a piezoelectric $Al_xGa_{1-x}N$ ($0.5 \leq x \leq 1$) thin film, comprising: bonding a device substrate to a piezoelectric $Al_xGa_{1-x}N$ ($0.5 \leq x \leq 1$) thin film; and lifting off the substrate; and forming an electrode on a face of the piezoelectric $Al_xGa_{1-x}N$ ($0.5 \leq x \leq 1$) thin film free of the substrate, wherein the face of the piezoelectric $Al_xGa_{1-x}N$ ($0.5 \leq x \leq 1$) thin film on which the electrode is formed has a metal polarity.

Advantages and benefits of the present disclosure will be described by reference to the accompanying drawings in the following detailed description of illustrative embodiments.

DETAILED DESCRIPTION

The present disclosure will now be described in detail with reference to the accompanying drawing(s).

Figure 6:
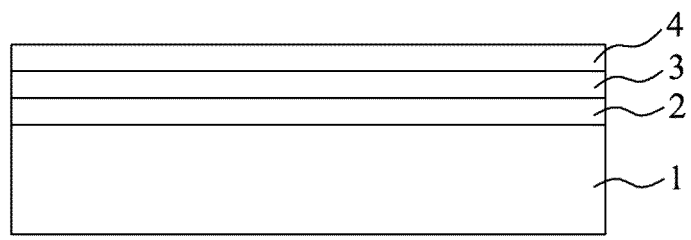
FIG. 6 illustrates an exemplary embodiment of a method for manufacturing piezoelectric $Al_xGa_{1-x}N$ ($0.5 \leq x \leq 1$) thin films and a structure in conjunction with the piezoelectric $Al_xGa_{1-x}N$ ($0.5 \leq x \leq 1$) thin films.

FIG. 6 illustrates an exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin film, in which the structure includes a sapphire substrate 1 for film synthesis, a first electrode 2, a sacrificial layer 3, and a piezoelectric $Al_xGa_{1-x}N$ (0.5≤x≤1) thin film 4.

Figure 7:
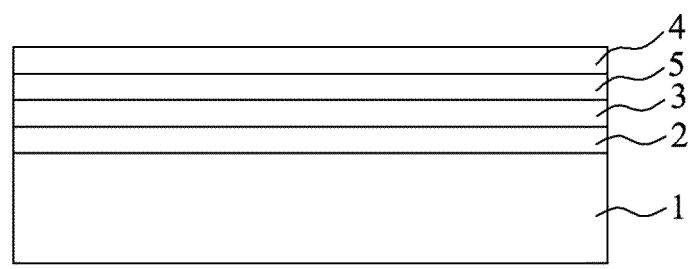
FIG. 7 illustrates another exemplary embodiment of a method for manufacturing piezoelectric $Al_xGa_{1-x}N$ ($0.5 \leq x \leq 1$) thin films and a structure in conjunction with the piezoelectric $Al_xGa_{1-x}N$ ($0.5 \leq x \leq 1$) thin films.

FIG. 7 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films, in which the structure includes a sapphire substrate 1 for film synthesis, a first semiconductor layer 2, a sacrificial layer 3 and a piezoelectric $Al_xGa_{1-x}N$ (0.5≤x≤1) thin film 4, and additionally or optionally, a second semiconductor layer 5 between the sacrificial layer 3 and the piezoelectric $Al_xGa_{1-x}N$ (0.5≤x≤1) thin film 4.

Figure 8:
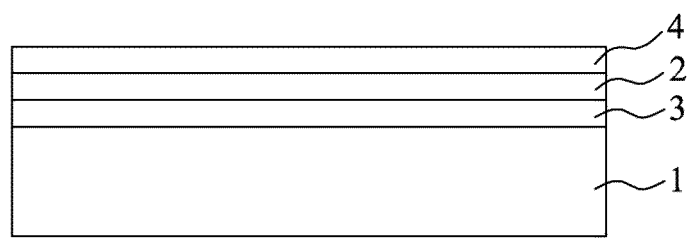
FIG. 8 illustrates another exemplary embodiment of a method for manufacturing piezoelectric $Al_xGa_{1-x}N$ ($0.5 \leq x \leq 1$) thin films and a structure in conjunction with the piezoelectric $Al_xGa_{1-x}N$ ($0.5 \leq x \leq 1$) thin films.

FIG. 8 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films, in which the structure includes a sapphire substrate 1 for film synthesis, a first semiconductor layer 2, a sacrificial layer 3 and a piezoelectric $Al_xGa_{1-x}N$ (0.5≤x≤1) thin film 4. Here, the sacrificial layer 3 is formed first, followed by the first semiconductor layer 2, which is different from the structure in FIG. 6.

Figure 9:
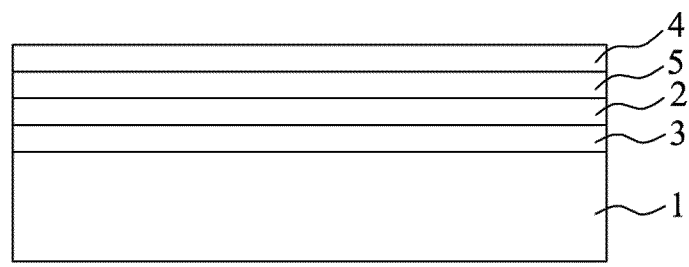
FIG. 9 illustrates another exemplary embodiment of a method for manufacturing piezoelectric $Al_xGa_{1-x}N$ ($0.5 \leq x \leq 1$) thin films and a structure in conjunction with the piezoelectric $Al_xGa_{1-x}N$ ($0.5 \leq x \leq 1$) thin films.

FIG. 9 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films, in which the structure includes a sapphire substrate 1 for film synthesis, a first semiconductor layer 2, a sacrificial layer 3, a piezoelectric $Al_xGa_{1-x}N$ (0.5≤x≤1) thin film 4, and a second semiconductor layer 5 between the sacrificial layer 3 and the piezoelectric $Al_xGa_{1-x}N$ (0.5≤x≤1) thin film 4. Here, the sacrificial layer 3 is formed first, followed by the first semiconductor layer 2, which is different from the structure in FIG. 7.

For example, C-plane (0002) sapphire substrates may be used. However, any off-angled C-plane sapphire substrate may also be used, provided the substrate has a plane of metal or gas polarity or a plane of mixed metal and gas polarity based on the growth preprocessing conditions of Group III nitride formed on the substrate. Besides a planar substrate, a nano-sized patterned sapphire substrate (PSS) can be used as well.

Referring to FIGS. 6-7, the first semiconductor layer 2 is comprised of $Al_yGa_{1-y}N$ (0.5≤y≤1) that is grown at high temperatures (e.g., at least 1000° C. or higher), not low temperatures, such that it plays a key role in ensuring the crystalline and polar qualities of the piezoelectric $Al_xGa_{1-x}N$ (0.5≤x≤1) thin film 4 to be grown subsequently. Hence, it differs from any other buffer layers that are grown at lower temperatures than an optimum growth temperature. The first semiconductor layer 2 may be grown by CVD (e.g., MOCVD, HVPE, ALD). The first semiconductor layer 2 comprised of $Al_yGa_{1-y}N$ (0.5≤y≤1) may have a thickness without specific upper or lower limits, but it is preferably 100 nm-20 μm thick such that its stress control function can be properly performed to maintain thickness uniformity of the piezoelectric $Al_xGa_{1-x}N$ (0.5≤x≤1) thin film 4. For example, for AlN, a 100% Al or Al-rich AlGaN (e.g., at least 50% of Al/(Al+Ga)) film may be grown at a temperature of 1000-1400° C. and a pressure of 100-200 torr, under a $H_2$-rich atmosphere containing $N_2$ and $NH_3$ ($NH_3$ is contained relatively more than $N_2$) or under an atmosphere containing $NH_3$ and $N_2$. Before the first semiconductor layer 2 comprised of $Al_yGa_{1-y}N$ (0.5≤y≤1) is grown in optimum conditions described above (e.g., 1000-1400° C. and 100-200 torr), pre-processing is carried out, such as, inside of the chamber is treated with Al MOCVD source gas (e.g., TMAI) at 900-1000° C. for 10 seconds, and an AlN buffer layer of 20 nm or less is formed. It is also advantageous to intentionally include air voids in regions adjacent to the sapphire substrate 1 as well as within the first semiconductor layer 2 comprised of $Al_yGa_{1-y}N$ (0.5≤y≤1) such that high crystalline quality may be ensured, dislocation density may be reduced, and crack generation and propagation may be suppressed.

Referring to FIGS. 8-9, the first semiconductor layer 2 is preferably comprised of $Al_yGa_{1-y}N$ (0.5≤y≤1) of 100 nm or less. Here, again, it plays a key role in ensuring the crystalline and polar qualities of the piezoelectric $Al_xGa_{1-x}N$ (0.5≤x≤1) thin film 4 to be grown subsequently. The first semiconductor layer 2 can be deposited by PVD (e.g., sputtering or PLD) with a constant supply of oxygen (e.g., 3% of $O_2/(N_2+O_2)$ or less). The first semiconductor layer 2 serves as a nano-scaled AlN or Al-rich AlGaN seed layer. When $Al_yGa_{1-y}N$ (0.5≤y≤1) undergoes sputter deposition under an atmosphere containing a small amount of $O_2$, $Al_yGa_{1-y}N$ (0.5≤y≤1) crystals are formed into smaller islands, which serve a key role as seeds for the piezoelectric $Al_xGa_{1-x}N$ (0.5≤x≤1) thin film 4 grown by CVD (e.g., MOCVD, HVPE, ALD) that has enhanced surface roughness, reduced dislocation density within the thin film, and high crystalline and polar qualities. Preferably, the first semiconductor layer 2 has a thickness of 100 nm or less, and more preferably, 1 nm-30 nm to effectively prevent the generation and propagation of cracks in the piezoelectric $Al_xGa_{1-x}N$ (0.5≤x≤1) thin film 4. For example, the deposition may be carried out at a temperature of 300-500° C. and a pressure of $5\times10^{-3}$ mbar, under an Ar-rich atmosphere containing $N_2$ and $O_2$, with $N_2$ being contained relatively much more than $O_2$) (e.g., Ar=40 sccm, $N_2$=110 sccm, and $O_2$=4 sccm). This grown, piezoelectric $Al_xGa_{1-x}N$ (0.5≤x≤1) thin film 4 turned out to have FWHM of 0.04-0.06° as measured on the X-ray (0002) rocking curve. Compared with FWHM of the commercially available Si substrate/ $SiO_2$/metal electrode/AlN, 1.2-2.5°, the quality of the thin film here has been significantly enhanced.

The first semiconductor layer 2 shown in FIGS. 6-7 and the first semiconductor layer 2 shown in FIGS. 8-9 are similar in that they both contribute to ensuring high crystalline and polar qualities of the piezoelectric $Al_xGa_{1-x}N$ (0.5≤x≤1) thin film 4 to be grown subsequently.

Figure 1:
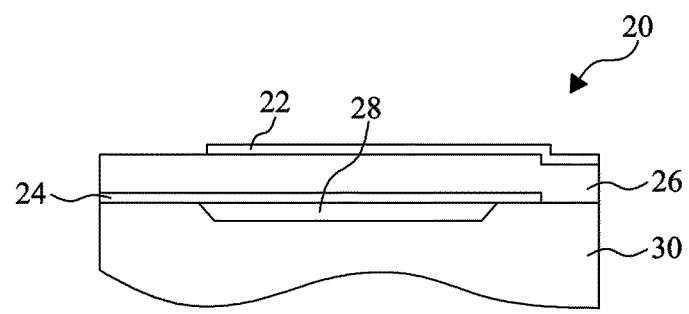
FIG. 1 illustrates devices in conjunction with a piezoelectric thin film as disclosed in US patent application publication No. 2015-0033520.
Figure 1:
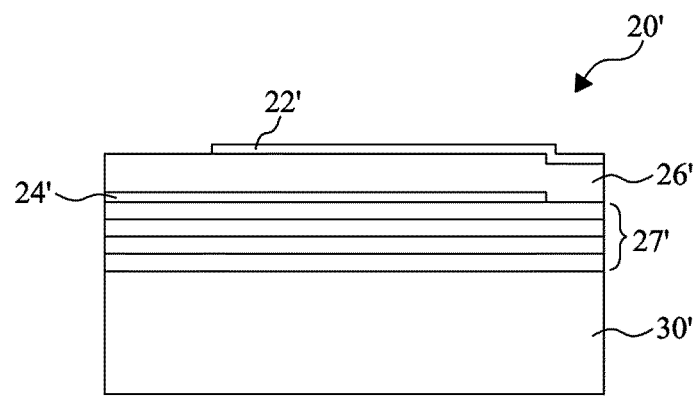
Figure 2:
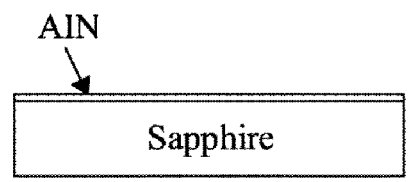
FIGS. 2, 3 and 4 show methods for manufacturing piezoelectric AlN thin films and devices in conjunction with the films as disclosed in US patent application publication No. 2015-0033520.
Figure 2:
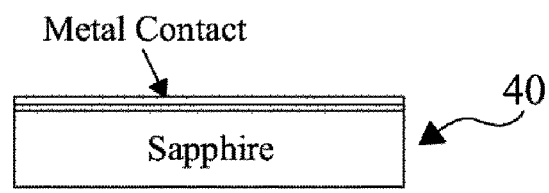

To facilitate laser lift-off (LLO) of the sapphire substrate 1, the sacrificial layer 3 preferably comprises a material region that is an optically transparent semiconductor with an energy band gap corresponding to a wavelength sufficiently larger than that of laser radiation entered through the back plane of the sapphire substrate 1 before the piezoelectric $Al_xGa_{1-x}N$ (0.5≤x≤1) thin film 4 is grown thereon and has an amorphous or polycrystalline, or multilayer microstructure capable of absorbing much of energy from the light source. For example, multilayers of $Al_{x1}Ga_{1-x1}N/Al_{x2}Ga_{1-x2}N$ ($x_2 < x_1 \leq 1$, $0 \leq x_2 < 0.5$), a single layer of at least 50% Ga-rich AlGaN (Ga/(Ga+Al)) can be provided. The sacrificial layer 3 can be grown by CVD (e.g., MOCVD, HVPE, ALD) and utilizes laser energy absorbed during LLO to separate the sapphire substrate 1 and the piezoelectric $Al_xGa_{1-x}N$ (0.5≤x≤1) thin film 4. Generally, it is proved by theories and experiments that $Al_zGa_{1-z}N$ has an energy bad gap, $E(z)=3.43+1.44z+1.33z^2$ (eV). For example, $Al_{0.5}Ga_{0.5}N$ with 50% of Al content will have an energy band gap of 4.48 eV. An energy band gap (eV) value of a semiconductor (including an insulator) is converted to a wavelength as one of optical properties according to the formula, $\lambda(nm)=1240/E(z)$. With this formula, 4.48 eV is then converted to 277 nm. Therefore, the sacrificial layer 3 comprising a single layer of GaN and $Al_zGa_{1-z}N$ with less than 50% of Al content or their multilayer microstructure can be easily removed by a high-power single wavelength laser light source (248 nm or higher) used universally. For example, the sacrificial layer 3 may have a thickness of 100 nm or less, and more preferably, 1 nm-30 nm to effectively prevent the generation and propagation of cracks in the piezoelectric $Al_xGa_{1-x}N$ (0.5≤x≤1) thin film 4. $Al_zGa_{1-z}N$ with less than 50% of Al content may be grown at a temperature of 900-1200° C. and a pressure of 100-200 torr, and GaN may be grown at a temperature of 600-1100° C. and a pressure of 100-200 torr. Between the growth of the sacrificial layer 3 on the sapphire substrate 1 and the growth of the piezoelectric $Al_xGa_{1-x}N$ (0.5≤x≤1) thin film 4, an AlN thin film serving as a seed layer should be deposited by sputtering. Prior to sputtering, the surface of the sacrificial layer 3 is stabilized inside the chamber by a large amount of $N_2$ gas containing a small amount of Ar (for surface planarization and cleaning through surface etching) and a very small amount of $O_2$. The piezoelectric $Al_xGa_{1-x}N$ (0.5≤x≤1) thin film 4 can be grown by CVD (e.g., MOCVD, HVPE, ALD) in form of a thin film by epitaxial synthesis. Its thickness can depend on a final device. For instance, if the piezoelectric $Al_xGa_{1-x}N$ (0.5≤x≤1) thin film is used for FBAR shown in FIG. 1B, the thickness of the thin film is determined based on the thickness of electrodes 22' and 24' on either side and resonance frequency. Additionally, the piezoelectric $Al_xGa_{1-x}N$ (0.5≤x≤1) thin film 4 may contain Ga. In this case, the Ga content in the first semiconductor layer 2, sacrificial layer 3 and second semiconductor layer 5 may be changed.

The second semiconductor layer 5 in FIG. 7 can be grown before the piezoelectric $Al_xGa_{1-x}N$ (0.5≤x≤1) thin film 4 is synthesized by CVD (e.g., MOCVD, HVPE, ALD). It can be comprised of a single layer of $Al_aGa_{1-a}N$ (0.5<a≤1) or multilayer of $Al_{b1}Ga_{1-b1}N/Al_{b2}Ga_{1-b2}N$ ($b_1 \neq b_2$) (preferably, at least 50% of Al content) and has a total content of Al higher than the sacrificial layer 3 such that it may resolve a difference in stress between the piezoelectric $Al_xGa_{1-x}N$ (0.5≤x≤1) thin film 4 and the Ga-rich sacrificial layer 3. Additionally or optionally, the second semiconductor layer 5 may have a gradation structure where the Al content gradually increases towards the piezoelectric $Al_xGa_{1-x}N$ (0.5≤x≤1) thin film 4 from the sacrificial layer 3. As shown in FIG. 9, although the first semiconductor layer 2 is provided between the piezoelectric $Al_xGa_{1-x}N$ (0.5≤x≤1) thin film 4 and the sacrificial layer 3, it is not thick enough. Therefore, the second semiconductor layer 5 is additionally provided as in FIG. 7 such that a difference in stress between the piezoelectric $Al_xGa_{1-x}N$ (0.5≤x≤1) thin film 4 and the Ga-rich sacrificial layer 3 can be resolved. Moreover, as the second semiconductor layer 5 plays a key role in determining overall thickness uniformity of a wafer during the growth of the piezoelectric $Al_xGa_{1-x}N$ (0.5≤x≤1) thin film 4, a Si and/or Mg dopant can be added to control wafer strain. For example, the second semiconductor layer 5 may have a thickness of 100 nm or less, and more preferably, 1 nm-30 nm to effectively prevent the generation and propagation of cracks in the piezoelectric $Al_xGa_{1-x}N$ (0.5≤x≤1) thin film 4.

Figure 3:
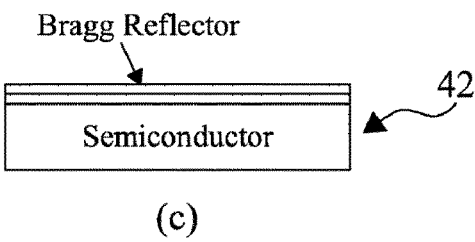
Figure 3:
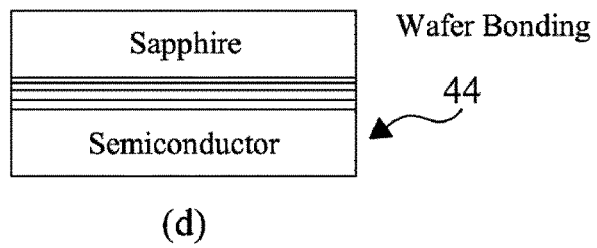
Figure 3:
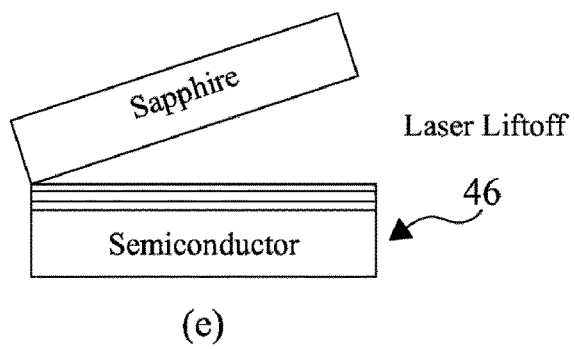
Figure 3:
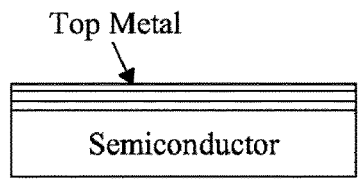
Figure 4:
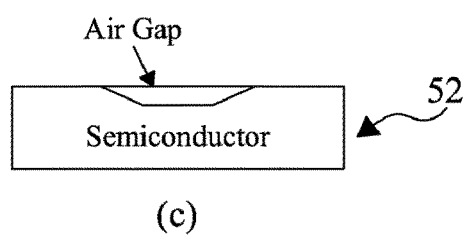
Figure 4:
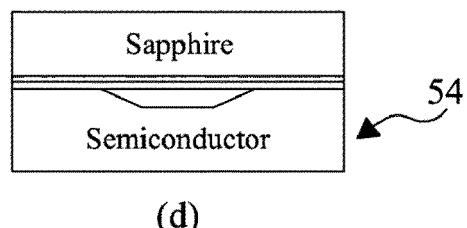
Figure 4:
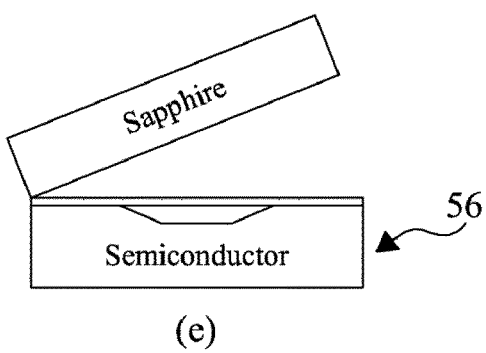
Figure 4:
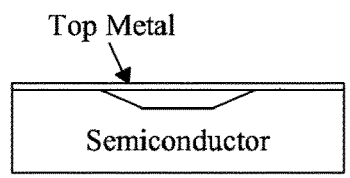
Figure 5:
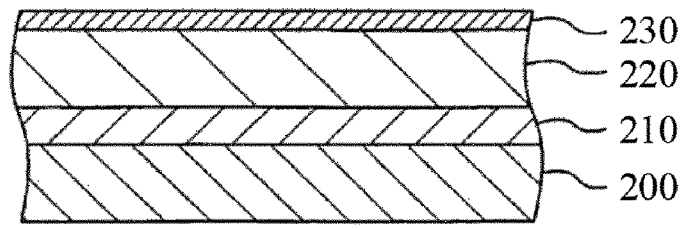
FIG. 5 illustrates a method for manufacturing a device in conjunction with piezoelectric AlN thin films as disclosed in US patent application publication No. 2006-0145785.
Figure 10:
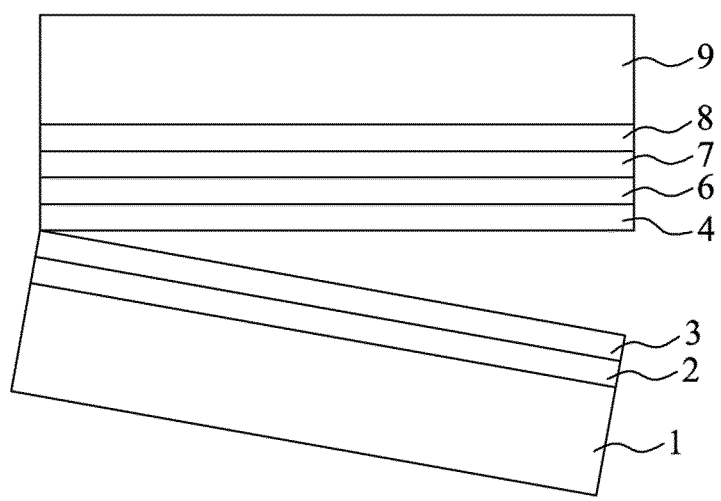
FIGS. 10, 11 and 12 illustrate an exemplary embodiment of methods for manufacturing a resonator in conjunction with a piezoelectric $Al_xGa_{1-x}N$ ($0.5 \leq x \leq 1$) thin film described in the disclosure.
Figure 11:
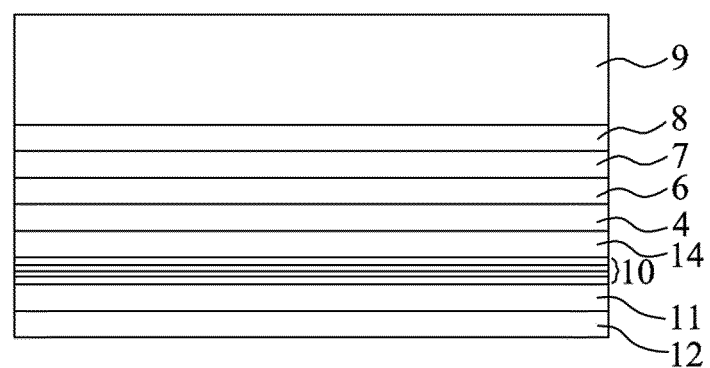
Figure 12:
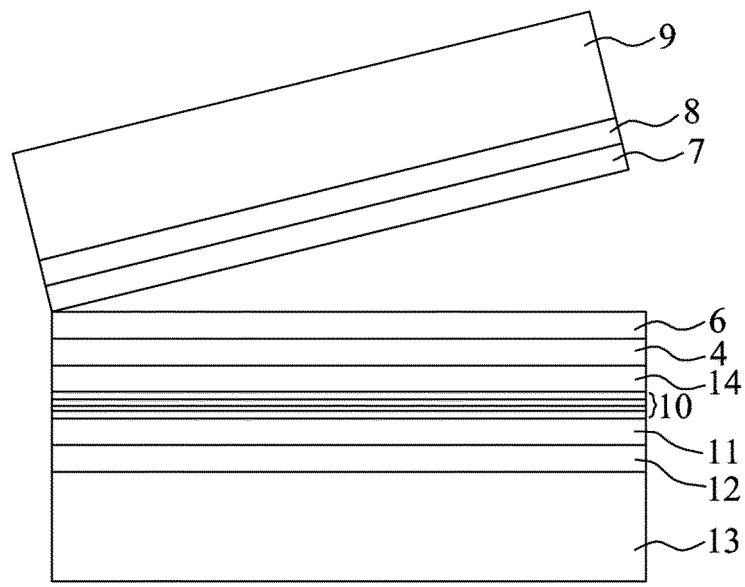

FIGS. 10-12 illustrate an exemplary embodiment of methods for manufacturing a resonator in conjunction with piezoelectric $Al_xGa_{1-x}N$ (0.5≤x≤1) thin film described in the disclosure. Here, the piezoelectric $Al_xGa_{1-x}N$ (0.5≤x≤1) thin films are used for resonators, but they can have a wider range of applications, without limitations, in devices or apparatus that use the piezoelectric $Al_xGa_{1-x}N$ (0.5≤x≤1) thin films after a sapphire substrate is lift off therefrom, including, for example, BAW and SAW resonators, and the methods illustrated in FIGS. 3-4 can also be incorporated here. Referring back to the structure illustrated in FIG. 6, a first electrode 6 (e.g., Mo, W, Ta, Pt, Ir, Ru, Rh, Re, Au, Cu, Al, Invar, or alloys thereof) is first formed on the piezoelectric $Al_xGa_{1-x}N$ (0.5≤x≤1) thin film 4 having an Al-polarity or Al-polarity and Ga-polarity mixed face, as shown in FIG. 10. Next, a first protection film 7 (e.g., Mo, W, Ta, Pt, Ti, TiW, TaN, TiN, $SiO_2$, $Al_2O_3$, SiC, SiCN, $SiN_x$, AlN, polyimide, BCB, SU-8, or SOG) is formed on the first electrode 6, followed by a first bonding layer 8 (e.g., SnIn, AuSn, AgIn, PdIn, NiSn, CuSn, Cu to Cu, Au to Au, epoxy, SU-8, or BCB). A temporary substrate 9 (e.g., sapphire, AlN, or glass) is provided on the first bonding layer 8 by wafer bonding. The sapphire substrate 1 is separated by LLO. This process may be accompanied by a metallic droplet removing process and a trimming process for precise control of thickness. Once the piezoelectric $Al_xGa_{1-x}N$ (0.5≤x≤1) thin film 4 goes through the LLO for separation from the sapphire substrate 1, metal droplet and trimming processes, its face becomes of N-polarity. Referring now to FIG. 11, a second electrode 14 (e.g., Mo, W, Ta, Pt, Ir, Ru, Rh, Re, Au, Cu, Al, Invar, or alloys thereof) and a Bragg reflector 10 (e.g., $SiO_2$/W) are deposited on the piezoelectric $Al_xGa_{1-x}N$ (0.5≤x≤1) thin film 4. Then, a second protective film 11 (e.g., Mo, W, Ta, Pt, Ti, TiW, TaN, TiN, $SiO_2$, $Al_2O_3$, SiC, SiCN, SiN$_x$, AlN, polyimide, BCB, SU-8, or SOG) is formed on the Bragg reflector 10, followed by a second bonding layer 12 (e.g., SnIn, AuSn, AgIn, PdIn, NiSn, CuSn, Cu to Cu, Au to Au, epoxy, SU-8, or BCB). Referring next to FIG. 12, a device substrate 13 (e.g., Si, GaAs, AlN, Mo, Cu, W, MoCu, CuW, Invar, or laminate) is provided on the second bonding layer 12 by wafer bonding such as eutectic bonding or brazing. Although not shown, an insulator material layer (protective layer) and a wafer bonding layer are formed in sequence, prior to the wafer bonding of the device substrate 13. Lastly, the temporary substrate 9, the first bonding layer 8 and the first protective film 7 are sequentially removed by thermal processing, laser radiation, and chemical/physical energy supply. This is applicable to those illustrated in FIGS. 7-9. Here, the second semiconductor layer 5 is also removed. After the wafer bonding process is carried out twice, the Al-polarity or Al-polarity and Ga-polarity mixed face of the piezoelectric Al$_x$Ga$_{1-x}$N (0.5≤x≤1) thin film 4 may serve as the top face of the resulting device. In other words, the device can have a chemically and structurally stable (e.g., corrosion resistant) face, which is advantageous for post processing and the quality control of a final device.

Figure 13:
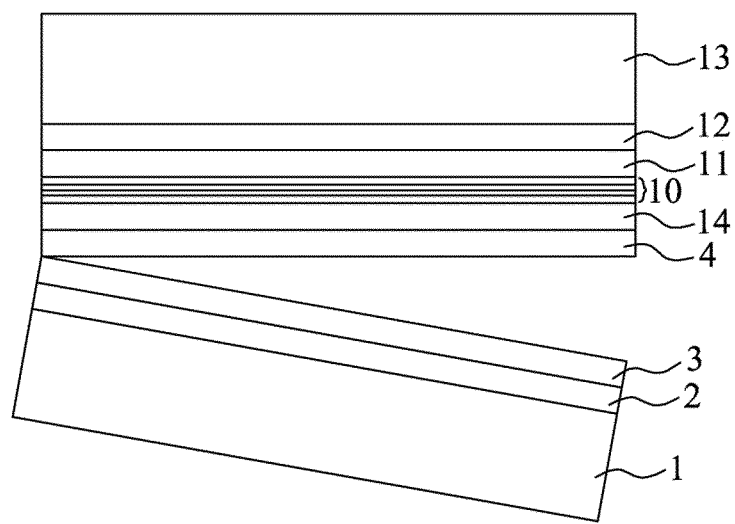
FIGS. 13 and 14 illustrate another exemplary embodiment of methods for manufacturing a resonator in conjunction with a piezoelectric $Al_xGa_{1-x}N$ ($0.5 \leq x \leq 1$) thin film described in the disclosure.
Figure 14:
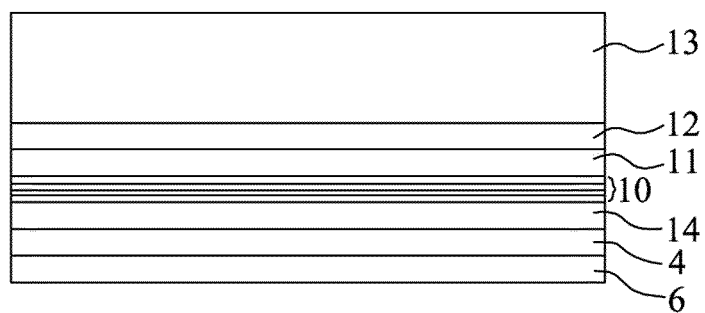
Figure 15:
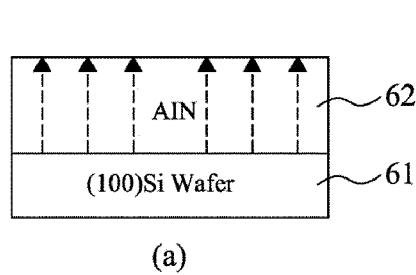
FIG. 15 illustrates a method for manufacturing a piezoelectric AlN thin film described in "Solid-State Electronics", 2010; Vol. 54: 1041-1046.
Figure 15:
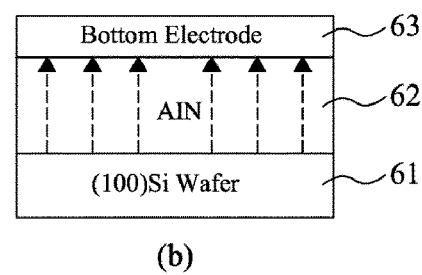
Figure 15:
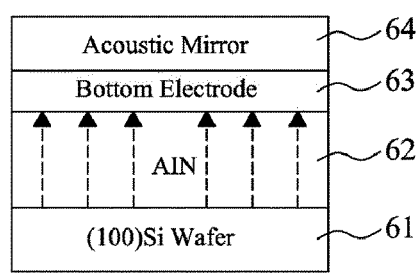
Figure 15:
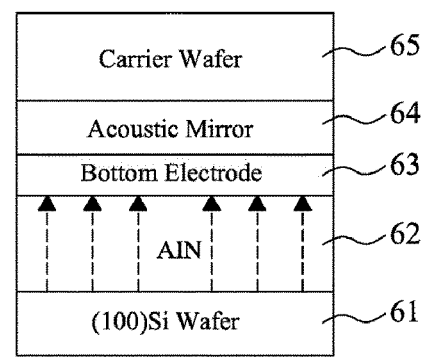
Figure 15:
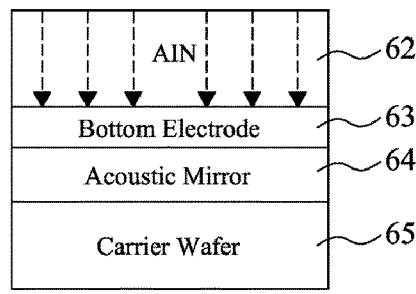
Figure 15:
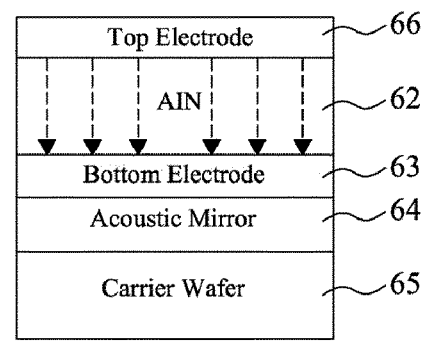

FIGS. 13-14 illustrate another exemplary embodiment of methods for manufacturing a resonator in conjunction with a piezoelectric Al$_x$Ga$_{1-x}$N (0.5≤x≤1) thin film described in the disclosure. Unlike the method in FIGS. 10-12, the temporary substrate 9 is not used. Referring to FIG. 13, the second electrode 14 (e.g., Mo, W, Ta, Pt, Ir, Ru, Rh, Re, Au, Cu, Al, Invar, or alloys thereof), the multilayer Bragg reflector 10 (e.g., SiO$_2$/W) are deposited on the piezoelectric Al$_x$Ga$_{1-x}$N (0.5≤x≤1) thin film 4, the second protective film 11, and the second bonding layer 12 are formed. The device substrate 13 is then provided by wafer bonding, and the sapphire substrate 1 is removed. Lastly, the first electrode 6 is formed, as shown in FIG. 14.

The resonator manufactured by the method illustrated in FIGS. 10-12 differs from the resonator manufactured by the method illustrated in FIGS. 13-14 in terms of the position of the second electrode 14 together with Bragg reflector 10 and the polarity of a face of the piezoelectric Al$_x$Ga$_{1-x}$N (0.5≤x≤1) thin film 4 depending on the number of times of the wafer bonding process being carried out. In particular, in the method illustrated in FIGS. 10-12, the wafer bonding process is carried out twice, and the second electrode 14 together with the Bragg reflector 10 can be arranged on an N-polarity face of the piezoelectric Al$_x$Ga$_{1-x}$N (0.5≤x≤1) thin film 4. Meanwhile, in the method illustrated in FIGS. 13-14, the wafer bonding process is carried once, and the second electrode 14 together with the Bragg reflector 10 can be arranged on an Al-polarity or Al-polarity and Ga-polarity mixed face of the piezoelectric Al$_x$Ga$_{1-x}$N (0.5≤x≤1) thin film 4. For reference, in case of a resonator in the art that uses polycrystalline AlN piezoelectric thin films grown on a conventional Si substrate by sputtering, it is not easy to control the face polarity and polarity ratio such that the polarity disposition of the second electrode 14 together with Bragg reflector 10 may not be readily determinable.

Figure 16:
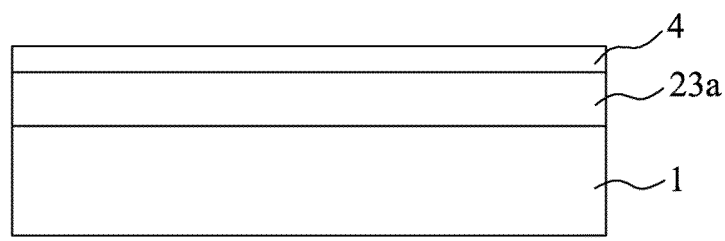
FIG. 16 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin film.

FIG. 16 illustrates another exemplary embodiment of a method for manufacturing piezoelectric Al$_x$Ga$_{1-x}$N (0.5≤x≤1) thin films and a structure in conjunction with the piezoelectric Al$_x$Ga$_{1-x}$N (0.5≤x≤1) thin films, in which the structure includes a sapphire substrate 1 for film synthesis, a sacrificial layer 23a, and a piezoelectric Al$_x$Ga$_{1-x}$N (0.5≤x≤1) thin film 4. The sacrificial layer 23a may be comprised of a Group III nitride in a single layer of Al$_c$Ga$_{1-c}$N (0≤c≤0.5) or multilayer of Al$_{c1}$Ga$_{1-c1}$N/ Al$_{c2}$Ga$_{1-c2}$N (c$_2$<c$_1$≤1, 0≤c$_2$<0.5) that is grown by CVD (e.g., MOCVD, ALD, or MBE). The piezoelectric Al$_x$Ga$_{1-x}$N (0.5≤x≤1) thin film 4 is deposited on the sacrificial layer 23a by PVD (e.g., sputtering or PLD) at 0.3 Tm (Tm is melting temperature of a material of the piezoelectric thin film) or higher, such that the quality of the thin film can be improved.

Figure 17:
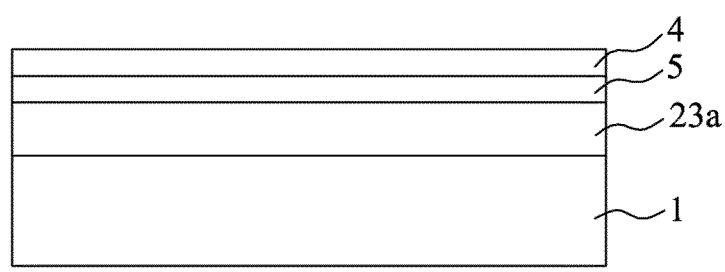
FIG. 17 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films.

FIG. 17 illustrates another exemplary embodiment of a method for manufacturing piezoelectric Al$_x$Ga$_{1-x}$N (0.5≤x≤1) thin films and a structure in conjunction with the piezoelectric Al$_x$Ga$_{1-x}$N (0.5≤x≤1) thin films, in which the structure includes a sapphire substrate 1 for film synthesis, and a series of layers formed on the substrate in sequence, including a sacrificial layer 23a, a second semiconductor layer 5, and a piezoelectric Al$_x$Ga$_{1-x}$N (0.5≤x≤1) thin film 4. This structure differs from the one shown in FIG. 16 in that it includes the second semiconductor layer 5 which has the same function as the second semiconductor 5 described in FIG. 7. The second semiconductor 5 is also grown by the same CVD as the sacrificial layer 23a, but it is comprised of a Group III nitride with a different composition Al$_a$Ga$_{1-a}$N (0.5<a≤1), controlling stress and ensuring thickness uniformity of the piezoelectric Al$_x$Ga$_{1-x}$N (0.5≤x≤1) thin film.

Figure 18:
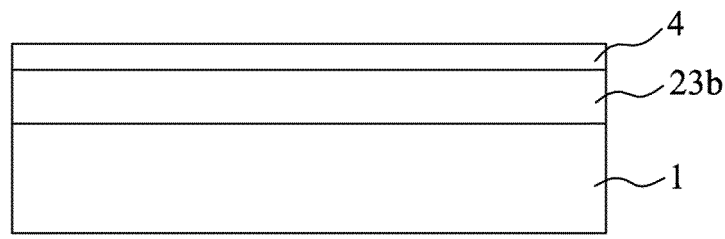
FIG. 18 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films.

FIG. 18 illustrates another exemplary embodiment of a method for manufacturing piezoelectric Al$_x$Ga$_{1-x}$N (0.5≤x≤1) thin films and a structure in conjunction with the piezoelectric Al$_x$Ga$_{1-x}$N (0.5≤x≤1) thin films, in which the structure includes a sapphire substrate 1 for film synthesis, a sacrificial layer 23b, and a piezoelectric Al$_x$Ga$_{1-x}$N (0.5≤x≤1) thin film 4. This structure differs from the one shown in FIG. 16 in that the sacrificial layer 23b is comprised of an oxide in a single layer of ZnO or ITO or multilayer including at least one of them (e.g., ZnO/ITO, ZnO/SiO$_2$, or ITO/SiO$_2$) that is deposited by PVD (e.g., sputtering or PLD). The piezoelectric Al$_x$Ga$_{1-x}$N (0.5≤x≤1) thin film 4 is deposited on the sacrificial layer 23b by PVD (e.g., sputtering or PLD) at 0.3 Tm (Tm is melting temperature of a material of the piezoelectric thin film) or higher, such that the quality of the thin film can be greatly improved.

Figure 19:
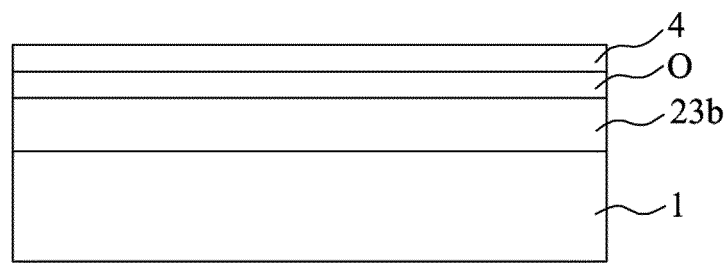
FIG. 19 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films.

FIG. 19 illustrates another exemplary embodiment of a method for manufacturing piezoelectric Al$_x$Ga$_{1-x}$N (0.5≤x≤1) thin films and a structure in conjunction with the piezoelectric Al$_x$Ga$_{1-x}$N (0.5≤x≤1) thin films, in which the structure includes a sapphire substrate 1 for film synthesis and a series of layers formed on the substrate in sequence, including a sacrificial layer 23b, an oxygen gas (O$_2$) inflow prevention layer O, and a piezoelectric Al$_x$Ga$_{1-x}$N (0.5≤x≤1) thin film 4. This structure differs from the one shown in FIG. 18 in that the oxygen gas inflow prevention layer O is additionally provided. The oxygen gas inflow prevention layer O is comprised of AlNO containing AlN and a very small amount of oxygen and is deposited on the sacrificial layer 23b by PVD (e.g., sputtering or PLD), followed by the piezoelectric Al$_x$Ga$_{1-x}$N (0.5≤x≤1) thin film 4 which is also deposited by the same process as the sacrificial layer 23b. In particular, the oxygen gas inflow prevention layer O prevents inflow of oxygen gas from the sacrificial layer 23b, leading to high purity piezoelectric Al$_x$Ga$_{1-x}$N (0.5≤x≤1) thin films.

Referring back to FIGS. 16-17, the sacrificial layer 23a may be comprised of a Group III nitride in a single layer of Al$_c$Ga$_{1-c}$N (0≤c≤0.5) or multilayer of Al$_{c1}$Ga$_{1-c1}$N/ Al$_{c2}$Ga$_{1-c2}$N (c$_2$<c$_1$≤1, 0≤c$_2$<0.5) that is epitaxially grown by CVD (e.g., MOCVD, HVPE, ALD, or MBE) at high (rather than low) temperatures (900° C. or higher), and ensures the crystalline and polar qualities of the subsequent, piezoelectric Al$_x$Ga$_{1-x}$N (0.5≤x≤1) thin film 4 deposited by PVD (e.g., sputtering or PLD) at 0.3 Tm (660° C. or higher).

In this regard, the sacrificial layer 23a is distinctive from conventional buffer layers which are grown at temperatures lower than optimum temperatures. Further, the sacrificial layer 23a embraces the role of the sacrificial layer 3 and the role of the first semiconductor layer 2 described in FIGS. 6-9. It may have a thickness without specific upper or lower limits but is preferably 50 nm-3 μm thick such that its stress control function can be properly performed to maintain thickness uniformity of the piezoelectric $Al_xGa_{1-x}N$ ($0.5≤x≤1$) thin film 4. For example, the sacrificial layer 23a can be grown at a temperature of 900-1100° C. and a pressure of 100-600 torr. More preferably, as shown in FIG. 17, the second semiconductor layer 5 may be provided between the sacrificial layer 23a and the piezoelectric $Al_xGa_{1-x}N$ ($0.5≤x≤1$) thin film 4 deposited subsequently. As a result, the piezoelectric $Al_xGa_{1-x}N$ ($0.5≤x≤1$) thin film 4 may have enhanced crystallinity and thickness uniformity. The second semiconductor layer 5 is epitaxially grown by the same CVD (e.g., MOCVD, HVPE, ALD, or MBE) as the sacrificial layer 23a and is preferably comprised of a Group III nitride with the identical/similar composition with/to the piezoelectric $Al_xGa_{1-x}N$ ($0.5≤x≤1$) thin film 4. During the deposition process of the piezoelectric $Al_xGa_{1-x}N$ ($0.5≤x≤1$) thin film 4, the sacrificial layer 23a and the second semiconductor layer 5 preferably control curvature in the substrate for film synthesis as much as they possible can (e.g., zero curvature or completely flat) to ensure high quality (crystallinity and polarity) and thickness uniformity of the film.

Referring now to FIGS. 18-19, the sacrificial layer 23b may be comprised of an oxide in a single layer of ZnO or ITO or multilayer including at least one of them (e.g., ZnO/ITO, ZnO/SiO$_2$, or ITO/SiO$_2$) that is deposited by PVD (e.g., sputtering or PLD). The single sacrificial layer 23b may have a thickness without specific upper or lower limits but is preferably 50 nm-3 μm thick such that its stress control function can be properly performed to maintain thickness uniformity of the piezoelectric $Al_xGa_{1-x}N$ ($0.5≤x≤1$) thin film 4. The sacrificial layer 23b may be deposited by PVD (e.g., sputtering or PLD). During the deposition process, the substrate for film synthesis is maintained at 750° C., and the pressure is kept between 10 and 20 mTorr under an atmosphere of Ar and O$_2$ gases (O$_2$ content is relatively lower, below 50%). More preferably, as shown in FIG. 19, the oxygen gas (O$_2$) inflow prevention layer O is provided between the sacrificial layer 23b and the piezoelectric $Al_xGa_{1-x}N$ ($0.5≤x≤1$) thin film 4 deposited subsequently, such that the piezoelectric $Al_xGa_{1-x}N$ ($0.5≤x≤1$) thin film 4 may have enhanced crystallinity and thickness uniformity. The oxygen gas inflow prevention layer O is comprised of AlNO containing AlN and a very small amount of oxygen and is deposited on the sacrificial layer 23b by PVD (e.g., sputtering or PLD), followed by the piezoelectric $Al_xGa_{1-x}N$ ($0.5≤x≤1$) thin film 4 which is also deposited by the same process as the sacrificial layer 23b. In particular, the oxygen gas inflow prevention layer O prevents inflow of oxygen gas from the sacrificial layer 23b, leading to high purity piezoelectric $Al_xGa_{1-x}N$ ($0.5≤x≤1$) thin films. In particular, when AlNO is applied as the oxygen gas inflow prevention layer O (that is, $Al_yGa_{1-y}N$ ($0.5≤y≤1$) is deposited by sputtering under an atmosphere containing a small amount of O$_2$), it is important to supply a designated amount of oxygen gas (e.g., 3% of O$_2$/(N$_2$+O$_2$) or less), with AlNO serving as a seed layer for obtaining a high purity piezoelectric $Al_xGa_{1-x}N$ ($0.5≤x≤1$) thin film 4. When $Al_yGa_{1-y}N$ ($0.5≤y≤1$) undergoes sputter deposition under an atmosphere containing a small amount of O$_2$, $Al_yGa_{1-y}N$ ($0.5≤y≤1$) crystals are formed into smaller islands, which serve a key role as seeds for the piezoelectric $Al_xGa_{1-x}N$ ($0.5≤x≤1$) thin film 4 grown by CVD (e.g., MOCVD, HVPE, ALD) that has enhanced surface roughness, reduced dislocation density within the thin film, and high crystalline and polar qualities. Preferably, the oxygen gas inflow prevention layer O has a thickness of 100 nm or less, and more preferably, 1 nm-30 nm to effectively prevent the generation and propagation of cracks in the piezoelectric $Al_xGa_{1-x}N$ ($0.5≤x≤1$) thin film 4. For example, the deposition may be carried out at a temperature of 300-500° C. and a pressure of $5×10^{-3}$ mbar.

Desirably, crystalline quality of those piezoelectric $Al_xGa_{1-x}N$ ($0.5≤x≤1$) thin film structures manufactured by the methods illustrated in FIGS. 16-19 is targeted for a low HWHM on the X-ray rocking curve (e.g., 0.1° or lower). Moreover, those structures advantageously have polar quality that can be freely controlled based on the face conditions of the sacrificial and second semiconductor layers 23a and 5 in the case of FIGS. 16-17, and based on the face conditions of the sacrificial and oxygen gas inflow prevention layers 23b and O.

Those methods for manufacturing a resonator illustrated in FIGS. 10-14 can also equally be applied to the structures in FIGS. 16-19.

To sum up, the sacrificial layer 23a, 23b shown in FIGS. 16-19 is characterized as follows: (i) it is arranged between the optically transparent substrate 1 for film synthesis and the high purity piezoelectric $Al_xGa_{1-x}N$ ($0.5≤x≤1$) thin film 4 and facilitate the laser lift-off (LLO) process of the thin film 4 from the substrate 1; (ii) it has an energy band gap (typically, 200 nm or higher) to be able to function as a sacrificial layer for the LLO process; (iii) it may be comprised of a CVD-grown Group III nitride or a PVD-grown Group II or III oxide (e.g., ZnO, In$_2$O$_3$, Ga$_2$O$_3$, or ITO); (iv) it is thermally stable at 0.3 Tm (660° C.) or higher, which allows high-temperature synthesis of piezoelectric $Al_xGa_{1-x}N$ ($0.5≤x≤1$) thin films 4; (v) it has a crystal structure that is identical/similar with/to the HCP crystal structure of the piezoelectric $Al_xGa_{1-x}N$ ($0.5≤x≤1$) thin film 4; (vi) it is a ceramic (nitride or oxide) material having surface roughness of 10 nm or less, which allows synthesis of high purity piezoelectric $Al_xGa_{1-x}N$ ($0.5≤x≤1$) thin films 4; and (vii) it preferably has a face free of any type of contaminants, which allows synthesis of high purity piezoelectric $Al_xGa_{1-x}N$ ($0.5≤x≤1$) thin films 4.

The sacrificial layer 23a may be grown to a high temperature epitaxial layer (a single layer or multilayer structure) including a buffer layer that is generally grown at low temperatures according to the art.

Additionally or optionally, before the synthesis of the piezoelectric $Al_xGa_{1-x}N$ ($0.5≤x≤1$) thin film 4, the face of the sacrificial layer 23a, 23b can be subjected to photo-lithographic etch patterning, in order to ensure a single crystal piezoelectric thin film having a tilted c-axis plane.

Additionally or optionally, once the piezoelectric $Al_xGa_{1-x}N$ ($0.5≤x≤1$) thin film 4 is synthesized or deposited, post-annealing (post-thermal treatment) may be carried out, in order to improve crystallinity and polarity of the thin film.

As described above, if the piezoelectric $Al_xGa_{1-x}N$ ($0.5≤x≤1$) thin film 4 is particularly required to have a uniform thickness, it is crucial that any structure underlying the piezoelectric $Al_xGa_{1-x}N$ ($0.5≤x≤1$) thin film 4, for example, the structure shown in FIG. 16 including the sapphire substrate 1 for film synthesis and the sacrificial layer 23a, the structure shown in FIG. 17 including the sapphire substrate 1 for film synthesis, the sacrificial layer 23a and the second semiconductor layer 5, the structure shown in FIG. 18 including the sapphire substrate 1 for film synthesis and the sacrificial layer 23b, and the structure shown in FIG. 19 including the sapphire substrate 1 for film synthesis, the sacrificial layer 23b and the oxygen gas inflow prevention layer O, should be able to maintain proper flatness at a deposition temperature of the piezoelectric $Al_xGa_{1-x}N$ (0.5≤x≤1) thin film 4, and the present disclosure provides a basis for maintaining such flatness. For example, the sapphire substrate 1 having the sacrificial layer 23a grown by CVD has an upward facing convex shape at room temperature, but when warmed up for PVD later, it gradually becomes flat with rising temperature until it has a downward facing concave shape. This behavior is affected by different coefficients of thermal expansion between the sapphire substrate 1 and the sacrificial layer 23a. With a properly designed sacrificial layer 23a, therefore, the piezoelectric $Al_xGa_{1-x}N$ (0.5≤x≤1) thin film 4 deposited subsequently can have a uniform thickness. This principle is equally applicable to the design of the second semiconductor layer 5, sacrificial layer 23b and oxygen gas inflow prevention layer O.

Figure 20:
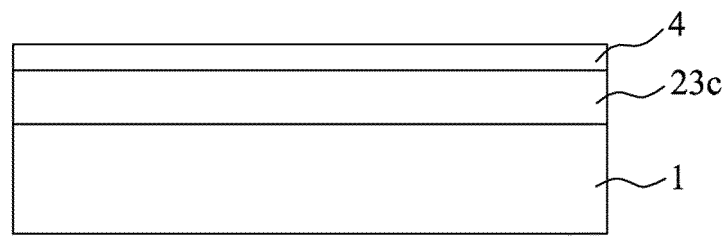
FIG. 20 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films.

FIG. 20 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films, in which the structure includes a silicon substrate 1 for film synthesis, a stress control layer 23c, and a piezoelectric $Al_xGa_{1-x}N$ (0.5≤x≤1) thin film 4.

While this structure is similar to the one shown in FIG. 16 in that the stress control layer 23c is grown by the same CVD as the sacrificial layer 23a and that the piezoelectric $Al_xGa_{1-x}N$ (0.5≤x≤1) thin film 4 is deposited by PVD, it uses a silicon substrate 1 instead of the sapphire substrate as in FIG. 16 and the stress control layer 23c is not separated by LLO as in FIG. 16, but it is removed together with the silicon substrate 1 through an etching process. Moreover, since the silicon substrate 1 has a different lattice constant and thermal expansion coefficient than the sapphire substrate 1, film synthesis conditions for the stress control layer 23c and piezoelectric $Al_xGa_{1-x}N$ (0.5≤x≤1) thin film 4 should be carefully set up so that the piezoelectric $Al_xGa_{1-x}N$ (0.5≤x≤1) thin film 4 would be resistant to cracking and have a uniform thickness across all faces. A suitable example for the silicon substrate 1 is an 8-in Si (111) substrate. Therefore, the stress control layer 23c is free from restrictions that the sacrificial layer 23a has to get adapted for LLO and simply focuses on the synthesis of a high quality piezoelectric $Al_xGa_{1-x}N$ (0.5≤x≤1) thin film 4.

The stress control layer 23c may be comprised of a Group III nitride in a single layer of $Al_gGa_{1-g}N$ (0≤g≤1) or multilayer of $Al_{h1}Ga_{1-h1}N/Al_{h2}Ga_{1-h2}N$ ($h_2<h_1$≤1, 0≤$h_2$≤1) that is epitaxially grown by CVD (e.g., MOCVD, HVPE, ALD, or MBE). The stress control layer 23c is primarily accountable for controlling stress, such as, preventing or mitigating wafer curvature and cracks caused by different physical properties (lattice constant and coefficient of thermal expansion) between the stress control layer 23c and the silicon substrate 1 at the optimum growth temperature. Among others, in the initial stage of forming the stress control layer 23c, it is important to prevent or minimize the reaction of the Group III nitride (Al, Ga) and Group V (N) elements in the stress control layer 23c with Si on the surface of the silicon substrate 1 to produce intermetallic compounds (Si—Al—(Ga)) and/or silicon nitride (Si(Al, Ga)$N_x$). As the piezoelectric $Al_xGa_{1-x}N$ (0.5≤x≤1) thin film 4 is deposited by PVD (e.g., sputtering or PLD) on the stress control layer 23c at 0.3 Tm (Tm is melting temperature of a material of the piezoelectric thin film) or higher, the quality of the thin film can be improved.

The stress control layer 23c may be formed at 500° C. or higher and may have a thickness without specific upper or lower limits, but it is preferably 50 nm-3 μm thick such that its stress control function can be properly performed to maintain thickness uniformity of the piezoelectric $Al_xGa_{1-x}N$ (0.5≤x≤1) thin film 4. For example, the stress control layer 23c may be grown at a temperature of 500-1100° C. and a pressure of 100-600 torr.

Figure 21:
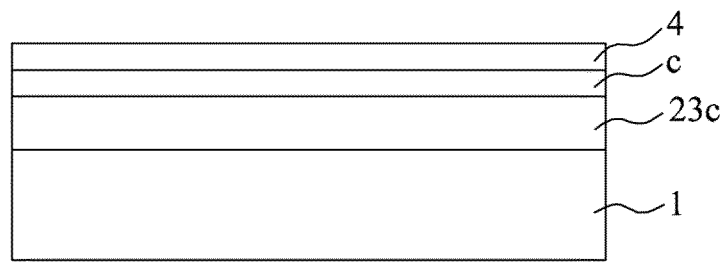
FIG. 21 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films.

FIG. 21 illustrates another exemplary embodiment of a method for manufacturing piezoelectric $Al_xGa_{1-x}N$ (0.5≤x≤1) thin films and a structure in conjunction with the piezoelectric $Al_xGa_{1-x}N$ (0.5≤x≤1) thin films, in which the structure includes a silicon substrate 1 for film synthesis, and a series of layers a series of layers formed on the substrate in sequence, including a stress control layer 23c, a face polarity control layer C, and a piezoelectric $Al_xGa_{1-x}N$ (0.5≤x≤1) thin film 4. The presence of the face polarity control layer C makes this structure different from the one shown in FIG. 20. Similar to the stress control layer 23c, the face polarity control layer C is grown by CVD (e.g., MOCVD, HVPE, ALD, or MBE) and may be comprised of a Group III nitride in a single layer of $Al_kGa_{1-k}N$ (0≤k≤1) or multilayer of $Al_{m1}Ga_{1-m1}N/Al_{m2}Ga_{1-m2}N$ ($m_2<m_1$≤1, 0≤$m_2$≤1), with or without the same composition. Introducing the stress control layer 23c and the face polarity control layer C provides the piezoelectric $Al_xGa_{1-x}N$ (0.5≤x≤1) thin film 4 with a single polarity (metal or nitrogen gas polarity) face, minimal crystal defects, and controlled stress for thickness uniformity. Moreover, the piezoelectric $Al_xGa_{1-x}N$ (0.5≤x≤1) thin film 4 is deposited on the sacrificial layer 23b by PVD (e.g., sputtering or PLD) at 0.3 Tm (Tm is melting temperature of a material of the piezoelectric thin film) or higher, such that the quality of the thin film can be greatly improved. A metal-polarity face of the piezoelectric $Al_xGa_{1-x}N$ (0.5≤x≤1) thin film 4 deposited by PVD (e.g., sputtering or PLD) is provided by the face polarity control layer C which is grown by CVD (e.g., MOCVD, HVPE, ALD, or MBE) and then undergoes plasma treatment with a certain amount of oxygen (ratio). A nitrogen gas polarity face of the piezoelectric $Al_xGa_{1-x}N$ (0.5≤x≤1) thin film 4 deposited by PVD (e.g., sputtering or PLD) is provided by the face polarity control layer C which is added (doped) with an excess amount of magnesium (Mg) during the CVD (e.g., MOCVD, HVPE, ALD, or MBE) growth (SCIENTIFIC REPORT, International polarity conversion of AlN epitaxial layers by oxygen, published online: 20 Sep. 2018). Alternatively, a face of the stress control layer 23c may be subjected to plasma treatment or added (doped) with an excessive amount of Mg during the growth to control polarity of the piezoelectric $Al_xGa_{1-x}N$ (0.5≤x≤1) thin film 4.

Similar to the stress control layer 23c, the face polarity control layer C is preferably comprised of a Group III nitride grown at 500° C. or higher and at a pressure of 100-600 torr up to a thickness of 0.5 μm or less, with or without the same composition as the piezoelectric $Al_xGa_{1-x}N$ (0.5≤x≤1) thin film 4. During the deposition process of the piezoelectric $Al_xGa_{1-x}N$ (0.5≤x≤1) thin film 4, the stress control layer 23c and the face polarity control layer C preferably control curvature in the substrate for film synthesis as much as they possible can (e.g., zero curvature or completely flat) to ensure high quality (crystallinity and polarity) and thickness uniformity of the film.

The curvature of the silicon substrate 1 is affected by synthesis conditions (temperature and pressure) of films (23c, C and 4) to be formed on the substrate 1 as well as the thermal expansion coefficients and lattice constants of the substrate 1 and films 23c, C and 4. The curvature of the substrate 1 is preferably zero or at least it has an upward facing convex shape, but once the film synthesis is completed, it turns into a downward facing concave shape. With an amount of the curvature of the substrate 1 being measurable during the film synthesis, it is important that the curvature is kept at zero or has a convex shape even after the last synthesis of a film. However, it is not easy to control the curvature by CVD alone, especially if the coefficients of thermal expansion of the silicon substrate 1 and AlGaN are taken into consideration. Besides, enhanced quality of the stress control layer 23c and synthesis of the piezoelectric $Al_xGa_{1-x}N$ (0.5≤x≤1) thin film 4 at high temperatures such as 0.3 Tm (660° C.) are hard to achieve by PVD alone. Therefore, not only growing the stress control layer 23c and the face polarity control layer C by CVD but also depositing the piezoelectric $Al_xGa_{1-x}N$ (0.5≤x≤1) thin film 4 by PVD according to the present disclosure can provide the thin film 4 with excellent crystallinity and polarity, regardless of whether the silicon substrate 1 used for film synthesis has a lattice constant and thermal expansion coefficient significantly different from the thin film 4.

For example, 1) if the piezoelectric $Al_xGa_{1-x}N$ (0.5≤x≤1) thin film 4, preferably comprised of AlN, is going to be deposited by PVD (e.g., sputtering or PLD) at 800° C., the stress control layer 23c comprised of $Al_{0.9}Ga_{0.1}N$, may be formed by CVD (e.g., MOCVD) at a temperature of 500-900° C. and a pressure of 100-600 Torr at a thickness of 500 nm. 2) If the face polarity control layer C, preferably comprised of $Al_{0.9}Ga_{0.1}N$, is going to be formed by CVD (e.g., MOCVD) at a temperature of 500-1100° C. and a pressure of 100-600 Torr at a thickness of 100 nm, the stress control layer 23c, preferably comprised of $Al_{0.8}Ga_{0.2}N$, may be formed by CVD (e.g., MOCVD) at a temperature of 500-900° C. and a pressure of 100-600 Torr at a thickness of 500 nm, and the piezoelectric $Al_xGa_{1-x}N$ (0.5≤x≤1) thin film 4, preferably comprised of AlN, may be deposited by PVD (e.g., sputtering or PLD) at 800° C. Among others, it is very important that conditions (temperature and pressure) for growing the stress control layer and/or face polarity control layer C by CVD (e.g., MOCVD) on the silicon substrate 1 should be set properly to have minimal curvature (zero) on the substrate 1, and at the same time, to retain such state (i.e., zero curvature or at least a convex shape) at room temperature (25° C.) even after the growth process of the stress control layer 23c and/or face polarity control layer C by CVD (e.g., MOCVD) is completed. Hence, the crystal and polar qualities and thickness uniformity of the piezoelectric AlN thin film 4 formed subsequently may be determined depending on the film synthesis conditions described above and curvature behavior of the silicon substrate 1.

In regard to the crystalline quality, the piezoelectric $Al_xGa_{1-x}N$ (0.5≤x≤1) thin films 4 manufactured by the methods illustrated in FIGS. 20-21 both have an HWHM of 0.1° or lower on the X-ray rocking curve (XRC). Further, the structures in conjunction with these thin films advantageously have polar quality that can be freely controlled based on the face conditions of the stress control layer 23c and/or face polarity control layer C.

Preferably, each of the stress control and face polarity control layers 23c and C should be comprised of: (i) a Group III nitride grown by CVD (e.g., MOCVD, HVPE, ALD, or MBE); (ii) a material that is thermally stable at 0.3 Tm (660° C.) or higher, which allows high-temperature synthesis of piezoelectric $Al_xGa_{1-x}N$ (0.5≤x≤1) thin films 4; (iii) a material having a crystal structure that is identical/similar with/to the HCP crystal structure of the piezoelectric $Al_xGa_{1-x}N$ (0.5≤x≤1) thin film 4; (iv) a ceramic (nitride or oxide) material having surface roughness of 10 nm or less, which allows synthesis of high purity piezoelectric $Al_xGa_{1-x}N$ (0.5≤x≤1) thin films 4; and (v) a material having a face free of any type of contaminants, which allows synthesis of high purity piezoelectric $Al_xGa_{1-x}N$ (0.5≤x≤1) thin films 4.

Additionally or optionally, before the synthesis of the piezoelectric $Al_xGa_{1-x}N$ (0.5≤x≤1) thin film 4, the face of the stress control layer 23c and/or face polarity control layer C can be subjected to photo-lithographic etch patterning, in order to ensure a single crystal piezoelectric thin film having a titled c-axis plane.

The subsequent, piezoelectric $Al_xGa_{1-x}N$ (0.5≤x≤1) thin film 4 is deposited on the stress control layer 23c and/or face polarity control layer C on the silicon substrate 1 by PVD (e.g., sputtering or PLD) at 0.3 Tm (660° C.) which is significantly higher than 400° C. in the conventional film synthesis. This high temperature deposition results in a high-quality epitaxial crystal structure for the thin film 4.

Once the piezoelectric $Al_xGa_{1-x}N$ (0.5≤x≤1) thin film 4 is deposited, additionally or optionally, post annealing which is a high-temperature heat treatment, can be carried out to further increase the crystal and polar qualities of the thin film 4.

The stress control layer 23c is grown at 500° C. or higher, for example, at controlled temperatures with a low/medium/high gradation. Preferably, it is comprised of an AlGaN thin film with a minimum content of Ga known to readily react with Si. In this way, the reaction between Si in the substrate 1 and Ga produce intermetallic compounds can be suppressed, preventing the so-called melt-back phenomenon.

Additionally or optionally, a super-lattice structured intermediate layer can be provided between the stress control layer 23c and the piezoelectric $Al_xGa_{1-x}N$ (0.5≤x≤1) thin film 4, in order to suppress crystal defects.

Additionally or optionally, during the deposition process, Al content in the piezoelectric $Al_xGa_{1-x}N$ (0.5≤x≤1) thin film 4 and PVD temperature may be increased to suppress tensile stress and prevent micro cracks in the piezoelectric thin film 4.

This structure in conjunction with the piezoelectric $Al_xGa_{1-x}N$ (0.5≤x≤1) thin film 4 using the silicon substrate 1 can be manufactured by those methods illustrated in FIGS. 10-14 without much change, except that the Si substrate 1, stress control layer 23c and face polarity control layer C are removed by a combination of wet and dry etching techniques, rather than by LLO. In this process, trimming for precise thickness control may be accompanied.

Figure 22:
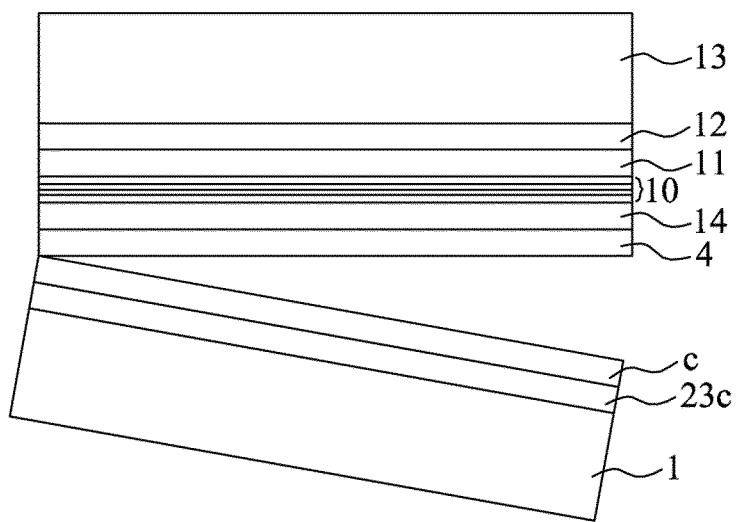
FIGS. 22 and 23 illustrate another exemplary embodiment of a method for manufacturing a resonator in conjunction with a piezoelectric $Al_xGa_{1-x}N$ (0.5≤x≤1) thin film described in the disclosure.
Figure 23:
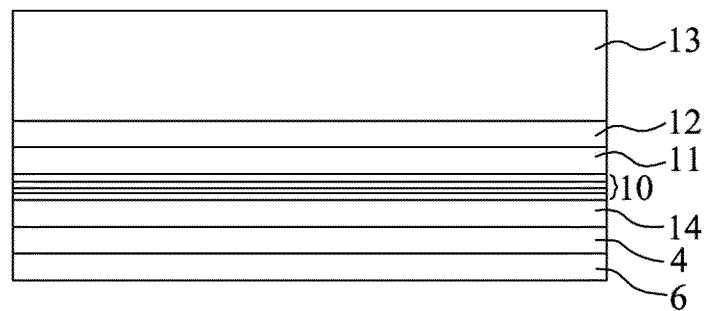

FIGS. 22-23 illustrate another exemplary embodiment of a method for manufacturing a resonator in conjunction with a piezoelectric $Al_xGa_{1-x}N$ (0.5≤x≤1) thin film described in the disclosure. Here, a silicon substrate 1 for film synthesis, a stress control layer 23c, and a face polarity control layer 3 are first provided. The face polarity control layer 3 is doped with Mg such that a subsequent, piezoelectric $Al_xGa_{1-x}N$ (0.5≤x≤1) thin film 4 has a nitrogen gas polarity face. Next, a second electrode 14, a Bragg reflector 10, a second protective film 11, a second bonding layer 12, and a device substrate 13 are formed in sequence. After the stress control layer 23c and the face polarity control layer 3 are removed from the piezoelectric $Al_xGa_{1-x}N$ (0.5≤x≤1) thin film 4, a first electrode 6 is provided to obtain a structure in conjunction with the piezoelectric $Al_xGa_{1-x}N$ (0.5≤x≤1) thin film 4 as shown. This method involves one wafer bonding process, instead of two as illustrated in FIGS. 10-12, and the top face of a resulting device or structure in conjunction with the piezoelectric $Al_xGa_{1-x}N$ ($0.5 \le x \le 1$) thin film 4 is thus an Al-polarity or Al-polarity and Ga-polarity mixed face.

In this resonator-based device manufactured according to the present disclosure, the position of the second electrode 14 together with the Bragg reflector 10 may be determined to allow polarity control of the piezoelectric $Al_xGa_{1-x}N$ ($0.5 \le x \le 1$) thin film 4 synthesized on the silicon substrate 1 as well as free selection of the polarity of a face of the piezoelectric $Al_xGa_{1-x}N$ ($0.5 \le x \le 1$) thin film 4 depending on the number of times of the wafer bonding process being carried out. In particular, in the method illustrated in FIGS. 10-12, the wafer bonding process is carried out twice and the second electrode 14 together with the Bragg reflector 10 may be arranged on an N-polarity face of the piezoelectric $Al_xGa_{1-x}N$ ($0.5 \le x \le 1$) thin film 4. Meanwhile, in the method illustrated in FIGS. 22-23, the wafer bonding process is carried once, and the second electrode 14 together with the Bragg reflector 10 may also be arranged on an N-polarity face of the piezoelectric $Al_xGa_{1-x}N$ ($0.5 \le x \le 1$) thin film 4. For reference, in case of a resonator device in the art that uses polycrystalline AlN piezoelectric thin films grown on a conventional Si substrate by sputtering at low temperatures, it is not easy to control the face polarity and polarity ratio such that the polarity disposition of the second electrode 14 together with Bragg reflector 10 may not be readily determinable. Because of this, it is rather difficult to manufacture a device of mixed and controlled polarity regardless of the positive/negative crystallinity, which in turn imposes limitations on performance improvement of the piezoelectric $Al_xGa_{1-x}N$ ($0.5 \le x \le 1$) thin film 4.

Now, applicable and/or additional embodiments of the present disclosure will be described.

(1) A method for manufacturing a piezoelectric $Al_xGa_{1-x}N$ ($0.5 \le x \le 1$) thin film, comprising: forming a sacrificial layer on a sapphire substrate for film synthesis; and growing a piezoelectric $Al_xGa_{1-x}N$ ($0.5 \le x \le 1$) thin film on the sacrificial layer, characterized in that the method further comprises forming a first semiconductor layer of $Al_yGa_{1-y}N$ ($0.5 \le y \le 1$) before growing the piezoelectric $Al_xGa_{1-x}N$ ($0.5 \le x \le 1$) thin film.

(2) There is also provided the method for manufacturing a piezoelectric $Al_xGa_{1-x}N$ ($0.5 \le x \le 1$) thin film of (1), wherein the first semiconductor layer is formed at 1000° C. or higher, prior to forming the sacrificial layer.

(3) There is also provided the method for manufacturing a piezoelectric $Al_xGa_{1-x}N$ ($0.5 \le x \le 1$) thin film of (1), wherein the first semiconductor layer is formed by PVD under an oxygen atmosphere, after forming the sacrificial layer.

(4) There is also provided the method for manufacturing a piezoelectric $Al_xGa_{1-x}N$ ($0.5 \le x \le 1$) thin film of (1), further comprising: forming a second semiconductor layer between the sacrificial layer and the piezoelectric $Al_xGa_{1-x}N$ ($0.5 \le x \le 1$) thin film, with the second semiconductor layer having an Al content greater than the sacrificial and less than the piezoelectric $Al_xGa_{1-x}N$ ($0.5 \le x \le 1$) thin film.

(5) A structure in conjunction with a piezoelectric $Al_xGa_{1-x}N$ ($0.5 \le x \le 1$) thin film, comprising: a piezoelectric $Al_xGa_{1-x}N$ ($0.5 \le x \le 1$) thin film; a first electrode provided on one side of the piezoelectric $Al_xGa_{1-x}N$ ($0.5 \le x \le 1$) thin film; a second electrode and reflector provided on the other side of the piezoelectric $Al_xGa_{1-x}N$ ($0.5 \le x \le 1$) thin film, opposite to the first electrode, wherein a face of the piezoelectric $Al_xGa_{1-x}N$ ($0.5 \le x \le 1$) thin film on which the first electrode is provided is an Al-polarity or Al-polarity and Ga-polarity mixed face.

(6) There is provided the structure in conjunction with a piezoelectric $Al_xGa_{1-x}N$ ($0.5 \le x \le 1$) thin film of (5), wherein the reflector is one of an air cavity or a Bragg reflector.

(7) When the first semiconductor layer 2 is grown at a high temperature by MOCVD, it is preferable to insert a plurality of air voids in order to reduce stress. During PVD, besides a small amount of oxygen, a dopant including Sc, Mg, or Zr, or an alloy thereof may be added to maximize the electro-mechanical coupling efficiency of a resulting device in conjunction with the piezoelectric film.

(8) The second semiconductor layer 5 may include Si and/or Mg and serves to reduce wafer stress prior to the growth of the piezoelectric $Al_xGa_{1-x}N$ ($0.5 \le x \le 1$) thin film such that the thin film may have a uniform thickness.

(9) A method for manufacturing a piezoelectric $Al_xGa_{1-x}N$ ($0.5 \le x \le 1$) thin film, comprising: forming a sacrificial layer on a sapphire substrate, the sacrificial layer being comprised of one of a Group III nitride formed by CVD or a Group II or III oxide formed by PVD; and depositing a piezoelectric $Al_xGa_{1-x}N$ ($0.5 \le x \le 1$) thin film on the sacrificial layer, the thin film being deposited by PVD at 0.3 Tm (Tm is melting temperature of a piezoelectric thin film material) or higher.

(10) There is the method for manufacturing a piezoelectric $Al_xGa_{1-x}N$ ($0.5 \le x \le 1$) thin film of (9), wherein the sacrificial layer is comprised of a Group III nitride in a single layer of $Al_cGa_{1-c}N$ ($0 \le c \le 0.5$) or multilayer of $Al_{c1}Ga_{1-c1}N/Al_{c2}Ga_{1-c2}N$ ($c_2 < c_1 \le 1$, $0 \le c_2 < 0.5$) that is epitaxially grown by CVD.

(11) There is the method for manufacturing a piezoelectric $Al_xGa_{1-x}N$ ($0.5 \le x \le 1$) thin film of (9), further comprising: forming a second semiconductor layer between the sacrificial layer and the piezoelectric $Al_xGa_{1-x}N$ ($0.5 \le x \le 1$) thin film, with the second semiconductor layer being comprised of a Group III nitride of $Al_aGa_{1-a}N$ ($0.5 < a \le 1$).

(12) (11) There is the method for manufacturing a piezoelectric $Al_xGa_{1-x}N$ ($0.5 \le x \le 1$) thin film of (9), wherein the sacrificial layer is comprised of a multilayer structured oxide formed by PVD, including at least one of a single layer of a Group II oxide or a single layer of a Group III oxide.

(13) (11) There is the method for manufacturing a piezoelectric $Al_xGa_{1-x}N$ ($0.5 \le x \le 1$) thin film of (9), further comprising: forming an oxygen gas ($O_2$) inflow prevention layer between the sacrificial layer and the piezoelectric $Al_xGa_{1-x}N$ ($0.5 \le x \le 1$) thin film by PVD to prevent inflow of oxygen from the sacrificial layer comprised of an oxide into the piezoelectric $Al_xGa_{1-x}N$ ($0.5 \le x \le 1$) thin film.

(14) A method for manufacturing a piezoelectric $Al_xGa_{1-x}N$ ($0.5 \le x \le 1$) thin film, comprising: forming a stress control layer comprised of a Group III nitride on a silicon substrate by CVD; and depositing a piezoelectric $Al_xGa_{1-x}N$ ($0.5 \le x \le 1$) thin film on the stress control layer, the thin film being deposited by PVD at 0.3 Tm (Tm is melting temperature of a piezoelectric thin film material) or higher.

(15) There is the method for manufacturing a piezoelectric $Al_xGa_{1-x}N$ ($0.5 \le x \le 1$) thin film of (14), further comprising: prior to depositing, carrying out pre-processing for controlling face polarity of the piezoelectric $Al_xGa_{1-x}N$ ($0.5 \le x \le 1$) thin film. Here, pre-processing involves intentional conversion of face polarity of the piezoelectric $Al_xGa_{1-x}N$ ($0.5 \le x \le 1$) thin film, including, without limitation, plasma treatment and addition (doping) of an excessive amount of magnesium (Mg).

(16) There is the method for manufacturing a piezoelectric $Al_xGa_{1-x}N$ ($0.5 \le x \le 1$) thin film of (15), further comprising: prior to depositing, forming a face polarity control layer, wherein the face polarity control layer is pre-processed such that the piezoelectric $Al_xGa_{1-x}N$ (0.5≤x≤1) thin film is deposited on the pre-processed face polarity control layer.

(17) A method for manufacturing a device in conjunction with piezoelectric $Al_xGa_{1-x}N$ (0.5≤x≤1) thin films, comprising: bonding a device substrate to a piezoelectric $Al_xGa_{1-x}N$ (0.5≤x≤1) thin film; and lifting off the substrate; and forming an electrode on a face of the piezoelectric $Al_xGa_{1-x}N$ (0.5≤x≤1) thin film free of the substrate, wherein the face of the piezoelectric $Al_xGa_{1-x}N$ (0.5≤x≤1) thin film on which the electrode is formed has a metal polarity. The methods illustrated in FIGS. 20-23 may be applied to the synthesis of a piezoelectric $Al_xGa_{1-x}N$ (0.5≤x≤1) thin film on a silicon substrate as well as to the manufacture of a device in conjunction with the piezoelectric $Al_xGa_{1-x}N$ (0.5≤x≤1) thin film. A typical example of such device is an RF resonator.

(18) There is the method for manufacturing a device in conjunction with piezoelectric $Al_xGa_{1-x}N$ (0.5≤x≤1) thin films of (17), further comprising: prior to bonding, carrying out pre-processing such that a face of the piezoelectric $Al_xGa_{1-x}N$ (0.5≤x≤1) thin film on which a device substrate is bonded has a nitrogen gas polarity.

The methods of the present disclosure allows to manufacture high purity $Al_xGa_{1-x}N$ (0.5≤x≤1) thin films and a resonator in conjunction with such films, wherein the resonator has a wide range of applications in different types of devices.

What is claimed is:

1. A method for manufacturing a piezoelectric $Al_xGa_{1-x}N$ (0.5≤x≤1) thin film, comprising:
    forming a sacrificial layer on a sapphire substrate for film synthesis; and
    growing a piezoelectric $Al_xGa_{1-x}N$ (0.5≤x≤1) thin film on the sacrificial layer,
    wherein the method further comprises forming a first semiconductor layer of $Al_yGa_{1-y}N$ (0.5≤y≤1) before growing the piezoelectric $Al_xGa_{1-x}N$ (0.5≤x≤1) thin film, and
    wherein the sacrificial layer has an Al content of less than 50%, and an energy band gap of the sacrificial layer is smaller than that of the piezoelectric $Al_xGa_{1-x}N$ (0.5≤x≤1) thin film.

2. The method of claim 1, wherein the first semiconductor layer is formed at 1000° C. or higher, prior to forming the sacrificial layer.

3. The method of claim 1, wherein the first semiconductor layer is formed by PVD under an oxygen atmosphere, after forming the sacrificial layer.

4. The method of claim 1, further comprising: forming a second semiconductor layer between the sacrificial layer and the piezoelectric $Al_xGa_{1-x}N$ (0.5≤x≤1) thin film, with the second semiconductor layer having an Al content greater than the sacrificial layer and less than the piezoelectric $Al_xGa_{1-x}N$ (0.5≤x≤1) thin film.

* * * * *